(12) United States Patent
Kato et al.

(10) Patent No.: US 8,081,121 B2
(45) Date of Patent: Dec. 20, 2011

(54) ARTICLE HAVING ELECTROMAGNETIC COUPLING MODULE ATTACHED THERETO

(75) Inventors: Noboru Kato, Moriyama (JP); Yuya Dokai, Nagaokakyo (JP); Nobuo Ikemoto, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 409 days.

(21) Appl. No.: 12/401,767

(22) Filed: Mar. 11, 2009

(65) Prior Publication Data
US 2009/0179810 A1 Jul. 16, 2009

Related U.S. Application Data

(63) Continuation of application No. PCT/JP2007/070460, filed on Oct. 19, 2007.

(30) Foreign Application Priority Data

Oct. 27, 2006 (JP) .................................. 2006-293025

(51) Int. Cl.
*H01Q 1/38* (2006.01)
(52) U.S. Cl. ................................ 343/700 MS; 343/850
(58) Field of Classification Search ........... 343/700 MS, 343/895, 702, 741, 742, 866, 867, 850
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |

(Continued)

FOREIGN PATENT DOCUMENTS

EP 0 694 874 A2 1/1996

(Continued)

OTHER PUBLICATIONS

Official communication issued in Japanese Application No. 2007-531524, mailed on Sep. 11, 2007.

(Continued)

*Primary Examiner* — Hoanganh Le
(74) *Attorney, Agent, or Firm* — Keating & Bennett, LLP

(57) ABSTRACT

An article having an electromagnetic coupling module attached thereto includes an electromagnetic coupling module and a PET bottle having the electromagnetic coupling module bonded thereto. The electromagnetic coupling module includes a wireless IC chip arranged to process transmission and reception signals and the feed circuit board having the wireless IC chip mounted thereon. The feed circuit board includes a feed circuit including a resonant circuit having a predetermined resonant frequency. The feed circuit performs characteristic impedance matching between the PET bottle and the wireless IC chip. The PET bottle functions as a radiator arranged to radiate a transmission signal supplied from the feed circuit using electromagnetic field coupling and to supply a received reception signal to the feed circuit using electromagnetic field coupling.

16 Claims, 24 Drawing Sheets

U.S. PATENT DOCUMENTS

| | | |
|---|---|---|
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0054755 A1 | 12/2001 | Kirkham |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2003/0020661 A1 | 1/2003 | Sato |
| 2004/0001027 A1 | 1/2004 | Killen et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0044769 A1 | 3/2006 | Forster et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0229278 A1 | 10/2007 | Nagata et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0135079 A1 * | 5/2009 | Dokai et al. ............... 343/850 |

FOREIGN PATENT DOCUMENTS

| | | |
|---|---|---|
| EP | 0 977 145 A2 | 2/2000 |
| EP | 1 976 056 A1 | 10/2008 |
| EP | 2 012 258 A1 | 1/2009 |
| JP | 50-143451 A | 11/1975 |
| JP | 62-127140 U | 8/1987 |
| JP | 03-262313 A | 11/1991 |
| JP | 04-150011 A | 5/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-176421 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-069533 A | 3/1998 |
| JP | 10-505466 A | 5/1998 |
| JP | 10-171954 A | 6/1998 |
| JP | 10-293828 A | 11/1998 |
| JP | 11-039441 A | 2/1999 |
| JP | 11-085937 A | 3/1999 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 3075400 U | 11/2000 |
| JP | 2001-028036 A | 1/2001 |
| JP | 2007-18067 A | 1/2001 |
| JP | 2001-66990 A | 3/2001 |
| JP | 2001-505682 A | 4/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2001-352176 A | 12/2001 |
| JP | 2002-024776 A | 1/2002 |
| JP | 2002-042076 A | 2/2002 |
| JP | 2002-063557 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-252117 A | 9/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |

| | | |
|---|---|---|
| JP | 2002-374139 A | 12/2002 |
| JP | 2003-006599 A | 1/2003 |
| JP | 2003-016412 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |
| JP | 2003-187211 A | 7/2003 |
| JP | 2003-188338 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-288560 A | 10/2003 |
| JP | 2003-309418 A | 10/2003 |
| JP | 2003-332820 A | 11/2003 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-297681 A | 10/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-124061 A | 5/2005 |
| JP | 2005-136528 A | 5/2005 |
| JP | 2005-165839 A | 6/2005 |
| JP | 2005-167327 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-270212 A | 10/2006 |
| JP | 2006-309401 A | 11/2006 |
| JP | 2007-043535 A | 2/2007 |
| JP | 2007-65822 A | 3/2007 |
| JP | 2007-122542 A | 5/2007 |
| JP | 2007-150868 A | 6/2007 |
| JP | 11-175678 A | 1/2009 |
| NL | 9100176 | 3/1992 |
| NL | 9100347 A | 3/1992 |
| WO | 00/10122 A2 | 2/2000 |
| WO | 03/079305 A1 | 9/2003 |
| WO | 2004/036772 A1 | 4/2004 |
| WO | 2004/070879 A1 | 8/2004 |
| WO | 2004/072892 A1 | 8/2004 |
| WO | 2005/073937 A | 8/2005 |
| WO | 2005/115849 A1 | 12/2005 |
| WO | 2005/122418 A1 | 12/2005 |
| WO | 2006/045682 A | 5/2006 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna," U.S. Appl. No. 11/928,502, filed Oct. 30, 2007.
Kato et al.: Wireless IC Device, U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Kato et al.: "Wireless IC Device and Wireless IC Device Composite Component," U.S. Appl. No. 12/276,444, filed Nov. 24, 2008.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.
Official Communication issued in International Application No. PCT/JP2007/066007, mailed on Nov. 27, 2007.

Dokai et al.: "Wireless IC Device and Component for Wireless IC Device," U.S. Appl. No. 12/359,690, filed Jan. 26, 2009.

Dokai et al.: "Test System for Radio Frequency IC Devices and Method of Manufacturing Radio Frequency IC Devices Using the Same," U.S. Appl. No. 12/388,826, filed Feb. 19, 2009.

Official Communication issued in International Application No. PCT/JP2008/061955, mailed on Sep. 30, 2008.

Official Communication issued in International Application No. PCT/JP2007/066721, mailed on Nov. 27, 2007.

Official Communication issued in International Application No. PCT/JP2007/070460, mailed on Dec. 11, 2007.

Kato et al.: "Wireless IC Device," U.S. Appl. No. 12/390,556, filed Feb. 23, 2009.

Kato et al.: "Inductively Coupled Module and Item With Inductively Coupled Module," U.S. Appl. No. 12/398,497, filed Mar. 5, 2009.

Official Communication issued in corresponding European Patent Application No. 07 830 194.2, mailed on Feb. 14, 2011.

Official Communication issued in corresponding European Patent Application No. 07830194.2, mailed on May 3, 2010.

* cited by examiner

ARTICLE HAVING ELECTROMAGNETIC COUPLING MODULE ATTACHED THERETO

BACKGROUND OF THE INVENTION

1. Field of the Invention

The present invention relates to an article having an electromagnetic coupling module attached thereto and, in particular, to an article having an electromagnetic coupling module including a wireless IC chip attached thereto that is used for a radio frequency identification (RFID) system.

2. Description of the Related Art

Recently, RFID systems have been developed. In RFID systems, a reader/writer that generates an induction field communicates with an IC tag (hereinafter, referred to as a wireless IC device) attached to an article in a non-contact manner. Thus, information is communicated therebetween. Examples of the wireless IC device used in the RFID system include a wireless IC device described in Japanese Unexamined Patent Application Publication No. 2006-203187.

The wireless IC device described in Japanese Unexamined Patent Application Publication No. 2006-203187 includes an antenna made of a metal wire arranged on a glass substrate or a PET film and a device forming layer arranged so as to at least partially overlap with the antenna. By attaching such a wireless IC tag to articles, the articles can be monitored and managed.

However, since the size of the wireless IC device is relatively large, the wireless IC device cannot be attached to a small article. In addition, a metallic antenna is required. Accordingly, in order to obtain a desired gain, the size of the antenna needs to be increased. Therefore, the size of the wireless IC device is further increased. Furthermore, a substrate must be accurately positioned when being attached on the antenna. Accordingly, the attachment procedure is relatively complicated. Still furthermore, the resonant frequency characteristic of the wireless IC device varies in accordance with the layout of the antenna. Therefore, it is difficult to attach the wireless antenna to a variety of articles even when it is desired that the wireless antenna be used in various ways.

SUMMARY OF THE INVENTION

To overcome the problems described above, preferred embodiments of the present invention provide a compact article having an electromagnetic coupling module attached thereto that has a stable frequency characteristic and is capable of being attached to a variety of articles.

According to a preferred embodiment of the present invention, an article having an electromagnetic coupling module attached thereto includes an electromagnetic coupling module and a dielectric body. The electromagnetic coupling module includes a wireless IC chip arranged to process a transmission signal and a reception signal and a feed circuit board connected to the wireless IC chip. The feed circuit board is provided with a feed circuit including a resonant circuit having a predetermined resonant frequency. The feed circuit board is bonded to the dielectric body. The feed circuit matches a characteristic impedance between the dielectric body and the wireless IC chip, and the dielectric body functions as a radiator to radiate a transmission signal supplied from the feed circuit via electromagnetic field coupling and supply a received reception signal to the feed circuit via electromagnetic field coupling.

According to a preferred embodiment of the present invention, an article having an electromagnetic coupling module attached thereto inputs electromagnetic waves to the dielectric body by matching the characteristic impedance of an input and output unit of the electromagnetic coupling module to the characteristic impedance of the boundary surface of the dielectric body. Thus, the dielectric body functions as an electromagnetic radiator. That is, according to a preferred embodiment of the present invention, a dielectric body having a dielectric constant of about 1 or greater functions as an antenna that is made of a metal in an existing electromagnetic coupling module. Examples of such a dielectric body include a ceramic, a PET bottle containing water or liquor, or living matter including a tree, a human body, and an animal. By using a dielectric body as an antenna, a variety of types of article can be integrated into an RFID system.

In the article having an electromagnetic coupling module attached thereto according to a preferred embodiment of the present invention, the antenna gain is determined by the size of the dielectric body. Accordingly, even when the size of the electromagnetic coupling module is reduced, a sufficient gain can be obtained. In addition, the frequency of a transmission signal radiated from the dielectric body and the frequency of a reception signal supplied to the wireless IC chip are substantially the same as a self-resonance frequency of the feed circuit of the feed circuit board. Accordingly, accurate positioning of the electromagnetic coupling module bonded onto the dielectric body is not required, and therefore, the electromagnetic coupling module can be easily bonded onto the dielectric body. Furthermore, a maximum gain of the transmission and reception signals is substantially determined by at least one of the size and shape of the feed circuit board, a distance between the feed circuit board and the dielectric body, and a medium disposed between the feed circuit board and the dielectric body.

In the article having an electromagnetic coupling module attached thereto according to a preferred embodiment of the present invention, the dielectric body can preferably include a first dielectric body that defines a container and a second dielectric body (e.g., a liquid) contained in the first dielectric body. In addition, it is preferable that the dimension of the dielectric body in a direction perpendicular or substantially perpendicular to the electromagnetic coupling module is at least about ⅛λ of a center frequency, for example, and even more preferably that the dimension of the dielectric body in a direction perpendicular or substantially perpendicular to the electromagnetic coupling module is at least about ½λ of the center frequency, for example.

In addition, the article having an electromagnetic coupling module attached thereto can preferably further include an impedance conversion interconnection electrode disposed in close proximity to the electromagnetic coupling module. The impedance conversion interconnection electrode may be disposed on or inside the dielectric body. Alternatively, the impedance conversion interconnection electrode may be provided on another dielectric body, and the other dielectric body is disposed on or inside the dielectric body. By providing the impedance conversion interconnection electrode, the transmission efficiency of the electromagnetic waves can be improved.

The wireless IC chip may preferably be connected to the feed circuit board so that they are electrically conductive with each other. Alternatively, the wireless IC chip may preferably be coupled to the feed circuit board via one of a magnetic field and an electric field. In addition, the wireless IC chip may preferably store information about the article having the electromagnetic coupling module attached thereon. The information may preferably be rewritable. Furthermore, the wireless IC chip may preferably have an information processing function, in addition to an information processing function regarding an RFID system.

In the article having an electromagnetic coupling module attached thereto according to a preferred embodiment of the present invention, it is preferable that the feed circuit is a lumped constant resonant circuit including a capacitance element and an inductance element. The lumped constant resonant circuit may preferably be one of an LC series resonant circuit and an LC parallel resonant circuit. Alternatively, the lumped constant resonant circuit may be configured so as to include a plurality of LC series resonant circuits or a plurality of LC parallel resonant circuits. The resonant circuit may be defined by a distributed constant resonant circuit. In such a case, an inductor of the resonant circuit is preferably defined by a stripline. However, if the resonant circuit is defined by a lumped constant resonant circuit that includes a capacitance element and an inductance element, the size of the feed circuit can be easily reduced and have a negligible negative effect of the other elements, such as the radiator. If the resonant circuit includes a plurality of resonant circuits, the frequency range of the transmission signal can be increased by coupling the plurality of resonant circuits with one another.

In addition, by arranging the capacitance element between the wireless IC chip and the inductance element, surge resistance can be improved. Since surge is a low-frequency electrical current having a frequency of about 200 MHz or less, the surge can be reduced by using a capacitor. Therefore, the wireless IC chip can be protected from surge damage.

The feed circuit board can preferably be a multilayer board formed by stacking a plurality of dielectric layers or a plurality of magnetic layers. In such a case, the capacitance element and the inductance element are disposed on a surface of the multilayer board and/or inside the multilayer board. By forming the resonant circuit using a multilayer board, components (e.g., interconnection electrodes) of the resonant circuit can preferably be disposed inside the board as well as on the board. Accordingly, the size of the board can be reduced. In addition, the layout of the components of the resonant circuit can be freely designed, and therefore, the performance of the resonant circuit can be easily improved. The multilayer board may preferably be a resin multilayer board formed by stacking a plurality of resin layers or may be a ceramic multilayer board formed by stacking a plurality of ceramic layers. Alternatively, the multilayer board may preferably be a thin-film multilayer board formed by using a thin-film forming technology. When the multilayer board is a ceramic multilayer board, it is preferable that the ceramic layers are made of a low-temperature co-fired ceramic material. This is because silver and copper having a low resistance value can preferably be used for resonant circuit members.

Alternatively, the feed circuit board may preferably be one of a dielectric single-layer board and a magnetic single-layer board. In such a case, the capacitance element and/or the inductance element are formed on the single-layer board. The material of the single-layer board may be a resin or a ceramic, for example. The capacitance of the capacitance element may be provided between a planar electrode disposed on the front surface of the single-layer board and a planar electrode disposed on the back surface of the single-layer board. Alternatively, the capacitance may be provided between electrodes arranged parallel or substantially parallel to each other on a surface of the single-layer board.

The feed circuit board may be a rigid or flexible board made of a resin or a ceramic, for example. If the board is rigid, the frequency of a transmission signal can be stabilized even when a wireless IC device is bonded to a dielectric body having any shape. In addition, the wireless IC chip can be stably mounted on the rigid board.

According to various preferred embodiments of the present invention, an electromagnetic coupling module can be bonded to a dielectric body without requiring particularly precise positioning. In addition, since the frequencies of a transmission signal and a reception signal are substantially determined by a feed circuit provided on a feed circuit board, the frequency characteristic is not changed even when the electromagnetic coupling module is combined with one or more dielectric bodies having a variety of shapes and sizes. Thus, a stable frequency characteristic can be obtained. As a result, a variety of types of article can be integrated into an RFID system.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 27A is a bottom view and FIG. 27B is an enlarged cross-sectional view.

DETAILED DESCRIPTION OF PREFERRED EMBODIMENTS

Various exemplary preferred embodiments of an electromagnetic coupling module according to the present invention are described below with reference to the accompanying drawings. The same reference numbers will be used to describe components and portions that are common to the following electromagnetic coupling modules and articles, and therefore, descriptions thereof are not repeated.

Article Having Electromagnetic Coupling Module Attached Thereto

Figure 1:
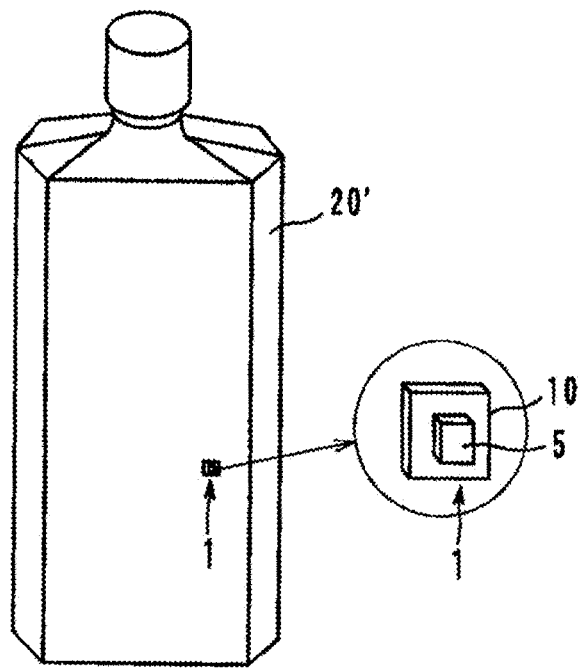
FIG. 1 is a perspective view of an article having an electromagnetic coupling module attached thereto according to a preferred embodiment of the present invention.

According to a preferred embodiment of the present invention, as shown in FIG. 1, an article having an electromagnetic coupling module attached thereto is a PET bottle 20' having a feed circuit board 10 mounted thereon. The feed circuit board 10 has a wireless IC chip 5 mounted thereon (hereinafter, the wireless IC chip 5 and the feed circuit board 10 are collectively referred to as an "electromagnetic coupling module 1"). The wireless IC chip 5 is arranged to process a transmission signal and a reception signal. The feed circuit board 10 includes a feed circuit. The feed circuit includes a resonant circuit having a predetermined resonant frequency. As used herein, the term "predetermined resonant frequency" refers to an operating frequency of the electromagnetic coupling module when the electromagnetic coupling module operates as a wireless IC device. The feed circuit matches a characteristic impedance between the PET bottle 20' and the wireless IC chip 5.

The PET bottle 20' contains a liquid, such as water, tea, juice, or liquor, for example. The PET bottle 20' functions as a dielectric body. The PET bottle 20' radiates into the air a transmission signal received from the feed circuit of the feed circuit board 10 via electromagnetic field coupling. In addition, the PET bottle 20' supplies a received reception signal to the feed circuit using electromagnetic field coupling. That is, substantially the entire body of the PET bottle 20' containing liquid functions as a radiator. While the feed circuit board is operating, capacitance is generated between electrodes of an inductance element or a capacitance element that defines a resonant circuit in the feed circuit board arranged so as to face the dielectric body (e.g., between a portion of an electrode and a portion of another electrode of an element) via the dielectric body (the PET bottle and the liquid in the PET bottle). Due to this capacitance, an electric field is generated in the dielectric body. The electric field propagates inside the liquid contained in the dielectric PET bottle. Thereafter, the electric field propagates from the PET bottle into the external space. Note that, due to the capacitance, an electrically closed circuit is formed by the feed circuit board, the wireless IC chip electrically connected to the feed circuit board, and the dielectric body defined by the PET bottle and the liquid at the operating frequency of the electromagnetic coupling module. In general, the frequencies of a transmission signal and a reception signal are determined by the feed circuit provided in the feed circuit board. The antenna gain can preferably be improved by using the PET bottle having a relatively large size. Therefore, even when the size of the electromagnetic coupling module is decreased, a sufficient gain can be obtained.

Since the feed circuit board 10 is bonded to the PET bottle 20' (a dielectric film) and is electromagnetically coupled with the PET bottle 20', a connection therebetween using application of heat to solder or a conductive adhesive agent is not required. In addition, strict management of the positioning of the feed circuit board 10 relative to the PET bottle 20' during bonding is not required. Accordingly, the manufacturing process is simplified. Furthermore, since the PET bottle 20' (the dielectric film) is not electrically connected to the electromagnetic coupling module 1, an effect of noise mixed with the electromagnetic waves can be reduced.

The dielectric body that defines a radiator is not limited to a dielectric film. For example, a ceramic, a tree, or a living organism, such as a human body or an animal, having a dielectric constant of at least 1 can be used for the radiator.

The wireless IC chip 5 may preferably be electrically conductively connected to the feed circuit board 10. Alternatively, the wireless IC chip 5 may preferably be magnetically or capacitively coupled with the feed circuit board 10. Such connection methods are described in detail below with reference to a variety of examples of the electromagnetic coupling module 1. In particular, when the wireless IC chip 5 is connected to the feed circuit board 10 using an insulating adhesive agent, capacitance can be generated therebetween by increasing the dielectric constant of the adhesive agent.

Figure 2:
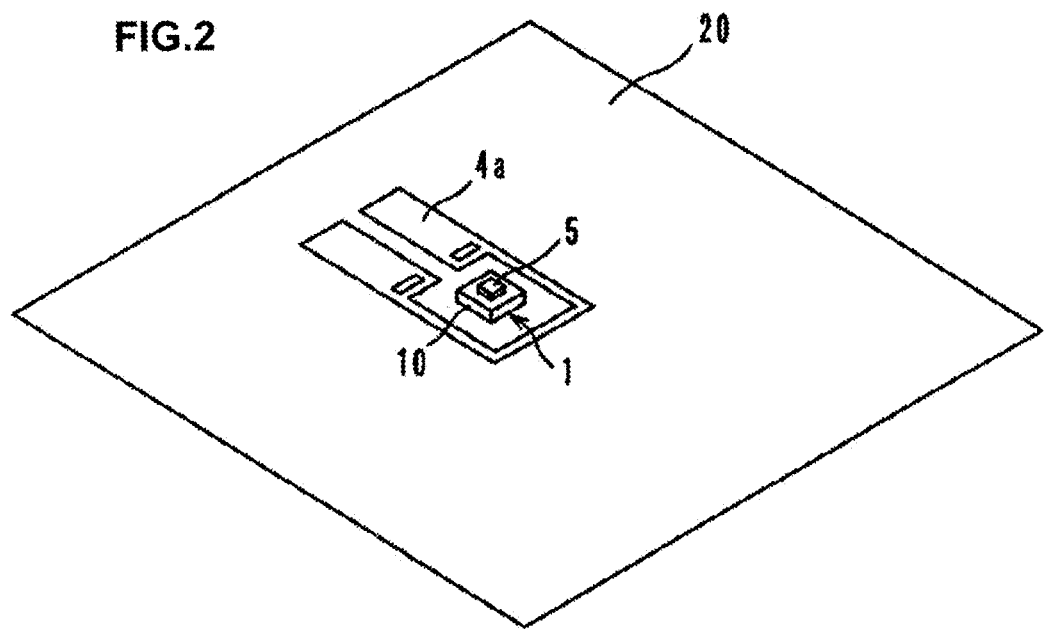
FIG. 2 is a perspective view illustrating a first example in which an impedance matching electrode pattern is disposed around the electromagnetic coupling module.
Figure 3:
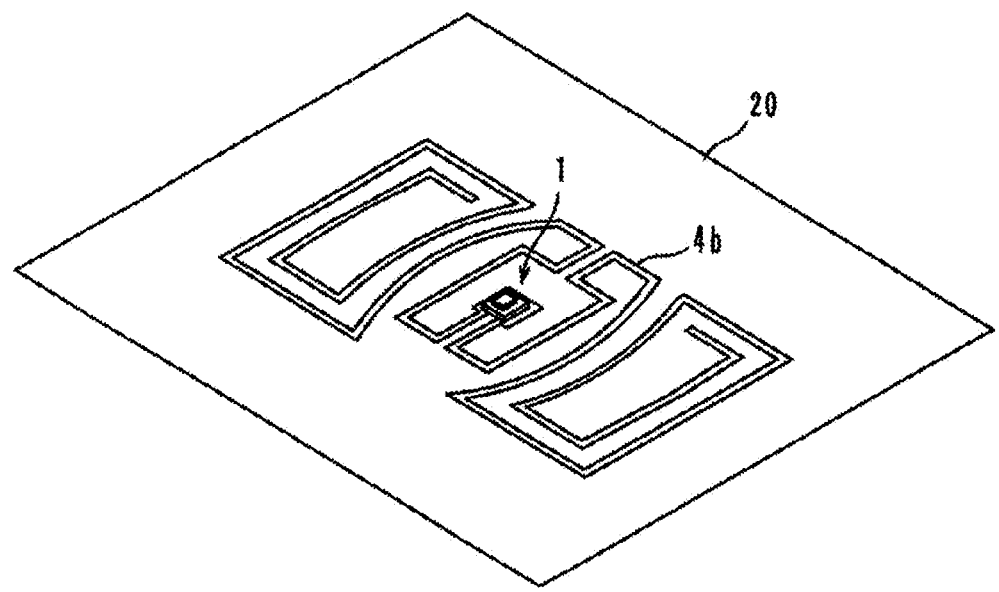
FIG. 3 is a perspective view illustrating a second example in which an impedance matching electrode pattern is disposed around the electromagnetic coupling module.
Figure 4:
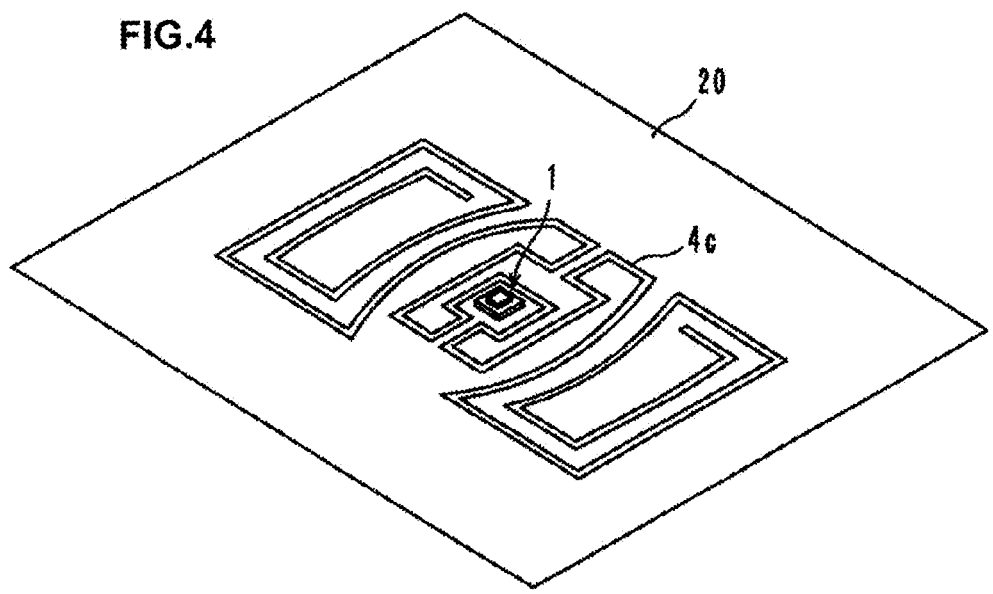
FIG. 4 is a perspective view illustrating a third example in which an impedance matching electrode pattern is disposed around the electromagnetic coupling module.

Note that, in order to adjust the characteristic impedance matching between the feed circuit board 10 and the dielectric film, impedance conversion electrodes 4a, 4b, and 4c may preferably be arranged so as to surround the feed circuit board 10 in the vicinity of the feed circuit board 10, as shown in FIGS. 2 to 4. The impedance conversion electrodes 4a, 4b, and 4c are electromagnetically coupled with the feed circuit board 10 so as to match the characteristic impedance of an input and output portion of the feed circuit board 10 to the characteristic impedance of electromagnetic waves on the interfacial surface of the dielectric film 20. In this manner, the transmission efficiency of the electromagnetic waves can be improved. As shown in FIGS. 2 and 4, the electrodes 4a and 4c are arranged so as to surround the feed circuit board 10. As shown in FIG. 3, the electrode 4b is arranged so as to extend along the outer periphery of the bottom surface of the feed circuit board 10.

It is preferable that the thickness of the dielectric body including the dielectric film 20 in a direction perpendicular or substantially perpendicular to the surface having the electromagnetic coupling module 1 mounted thereon is preferably at least about ⅛λ of a center frequency λ, for example. It is more preferable that the thickness of the dielectric materials is at least about ½λ, for example.

The wireless IC chip 5 stores information about the article having the electromagnetic coupling module 1 attached thereon. In addition, the information may preferably be rewritable. Furthermore, the wireless IC chip 5 may have an information processing function in addition to an information processing function regarding the RFID system.

Figure 5:
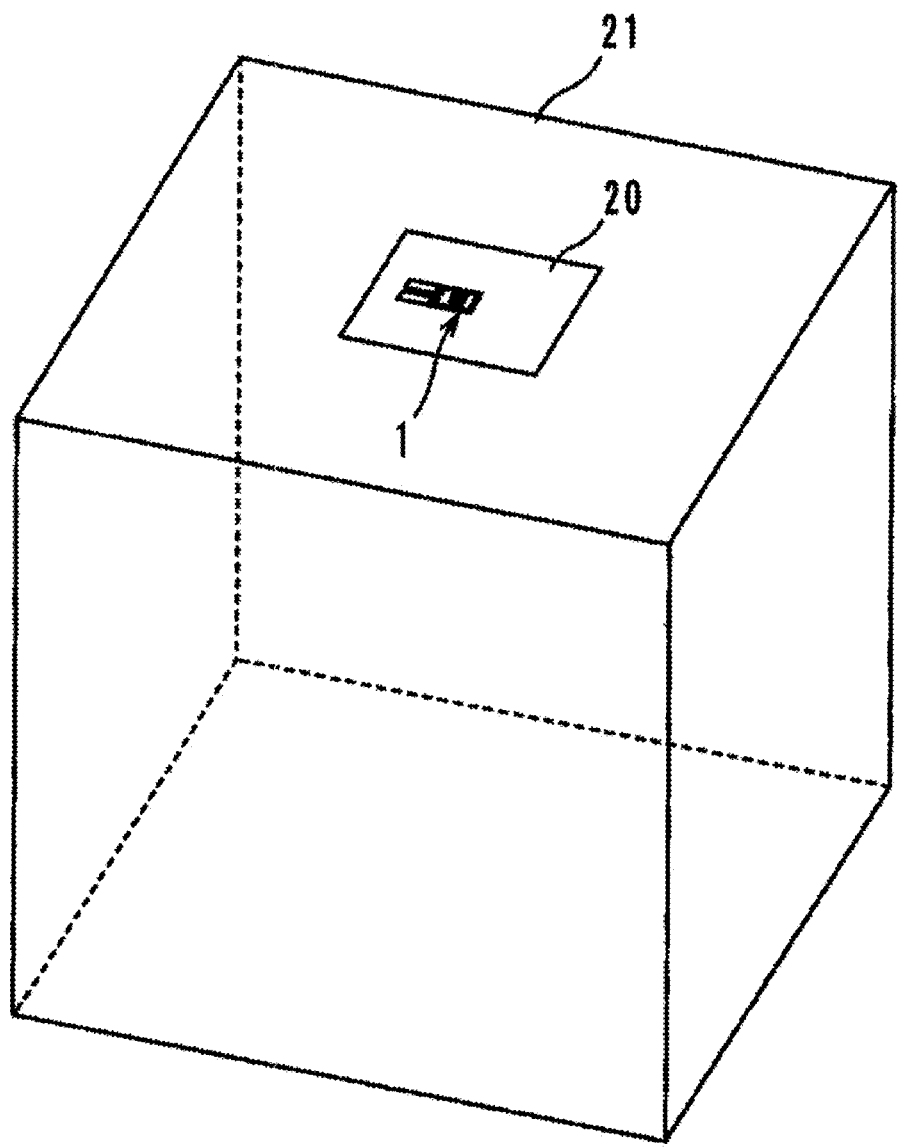
FIG. 5 is a perspective view illustrating a model in which the first preferred embodiment is disposed in water.
Figure 6:
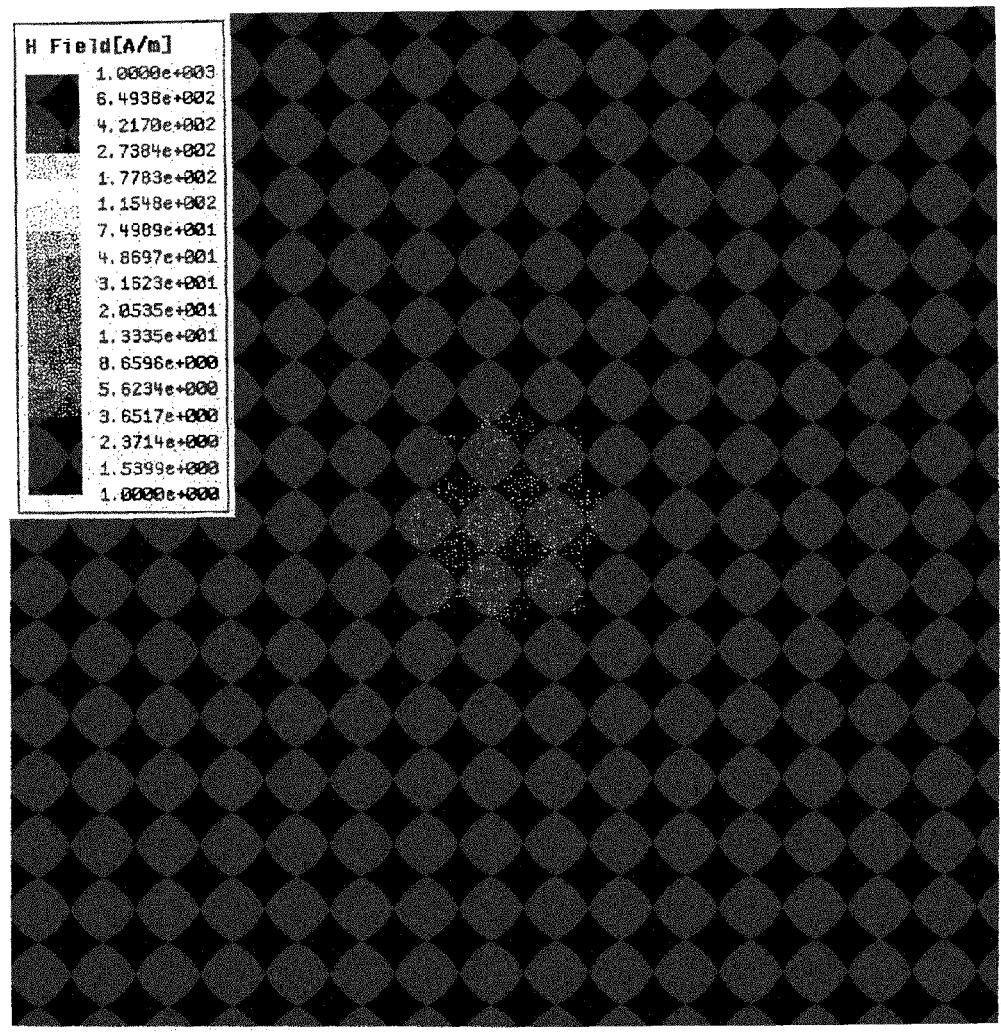
FIG. 6 is a schematic illustration illustrating a propagation simulation of an electromagnetic field using the model shown in FIG. 5.
Figure 7:
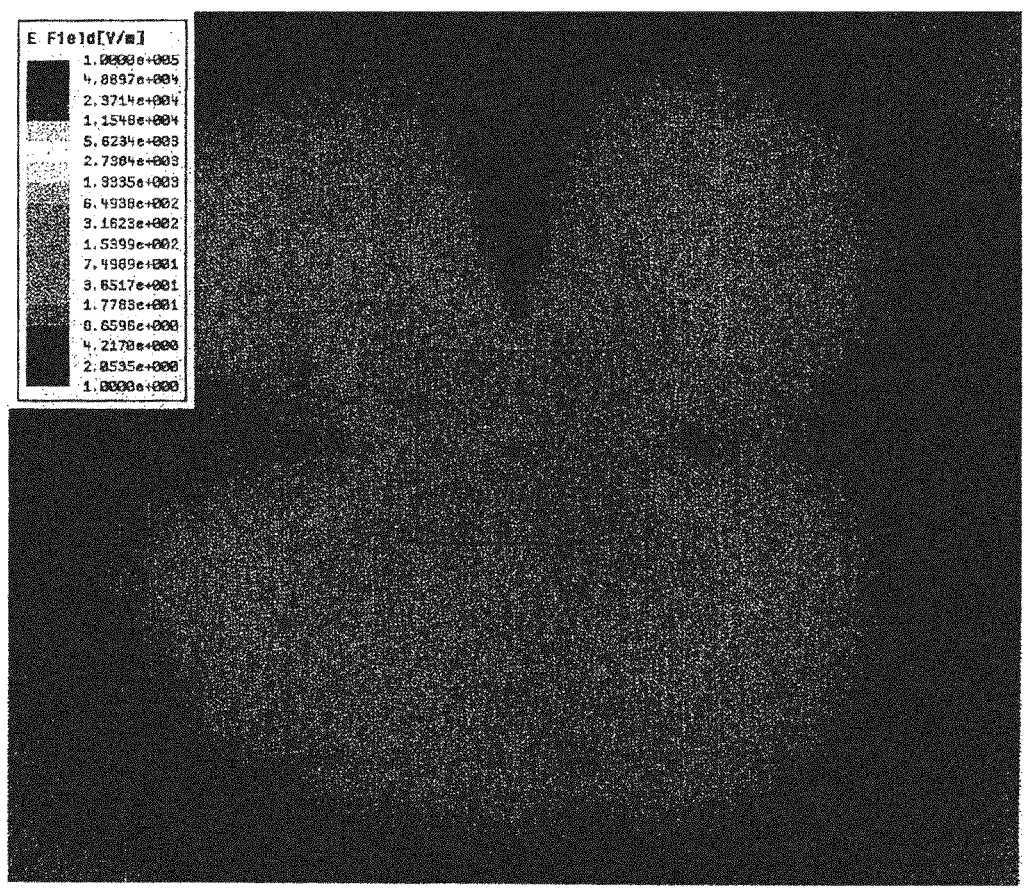
FIG. 7 is a schematic illustration illustrating a propagation simulation of an electromagnetic field using the model shown in FIG. 5.
Figure 8:
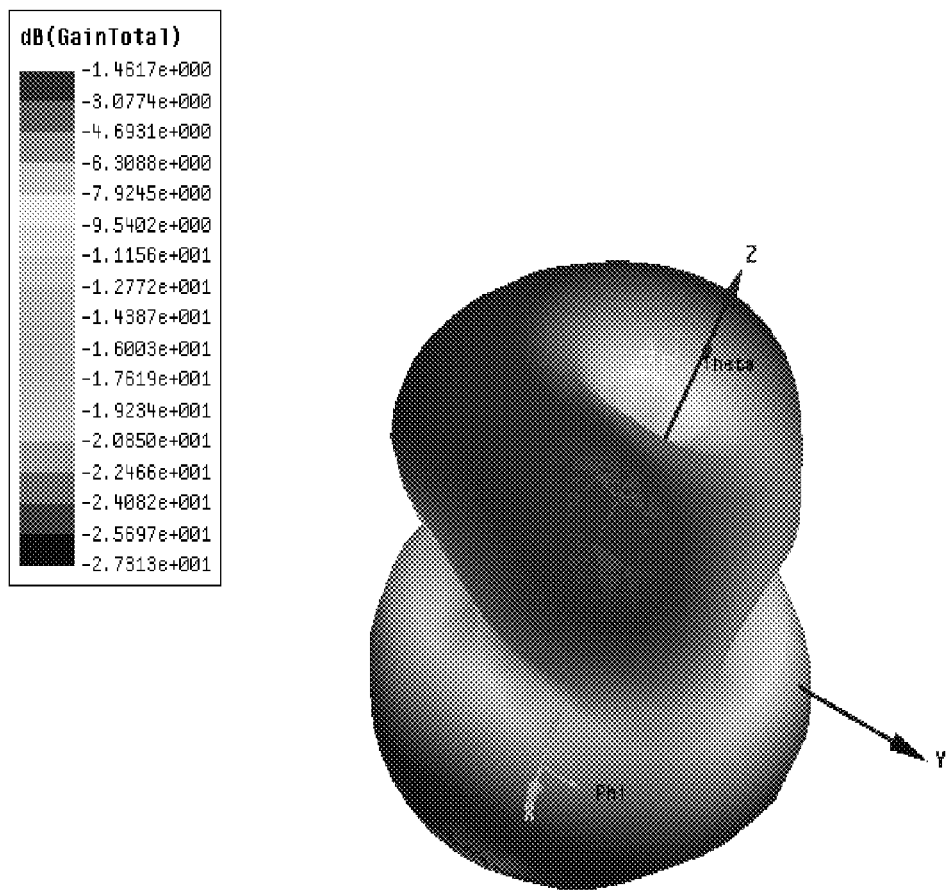
FIG. 8 is a schematic illustration illustrating the radiation directivity of electromagnetic waves in the model shown in FIG. 5.

For example, one model in which the electromagnetic coupling module 1 is attached to a dielectric body is a cubic PET bottle having sides of about 10 cm, for example, and containing water 21, as shown in FIG. 5. FIGS. 6 and 7 show the results of a simulation of electromagnetic field propagation using the water. In FIGS. 6 and 7, a square located at the approximate center represents the upper surface of the PET bottle having the electromagnetic coupling module 1 attached thereto. The electromagnetic coupling module is located in the middle portion of the upper side of the square at the center. As shown in FIG. 6, an electric field generated by the electromagnetic coupling module 1 spreads outward. As shown in FIG. 7, the electric field propagating in the water is widely distributed in the air. In addition, FIG. 8 illustrates the radiation directivity pattern of the electromagnetic waves.

For example, as shown in FIG. 2, when the impedance conversion electrode 4a is disposed on the dielectric film 20 and the dielectric film 20 is disposed on the PET bottle and if the resonant circuit in the feed circuit board 10 is resonated at the operating frequency of the electromagnetic coupling module 1, capacitance is generated between two open ends of the impedance conversion electrode 4a and the PET bottle and the water, respectively, which are dielectric bodies, via the dielectric film 20. Due to this capacitance, an electric field generated in the water propagates in the water and further propagates to outside the PET bottle. Note that as a larger electric field is generated in the water, a larger electric field propagates to the outside. Accordingly, a large capacitance must be generated between the impedance conversion electrode 4a and the dielectric body. In the impedance conversion electrode 4a shown in FIG. 2, in order to generate a large capacitance between the electrode 4a and each of the PET bottle and the water functioning as dielectric bodies, the length of the two open end portions thereof facing each other is increased or the areas of the open end portions are increased. The shape of the impedance conversion electrode 4a may preferably be one of the shapes shown in FIGS. 3 and 4 instead of the shape shown in FIG. 2. The impedance conversion electrodes 4b and 4c shown in FIGS. 3 and 4, respectively, have a spiral or substantially spiral shape, such that the length of a portion where lines are adjacent to each other is increased. Thus, a large capacitance can be generated between the lines.

In this example, the electromagnetic coupling module alone has a gain of about −40 dBi. Therefore, the electromagnetic coupling module does not function as a radiator. However, when the electromagnetic coupling module is attached to the cubic dielectric body having sides of about 10 cm, for example, the gain is increased to about −2 dBi, and therefore, the electromagnetic coupling module functions as a radiator.

Figure 9:
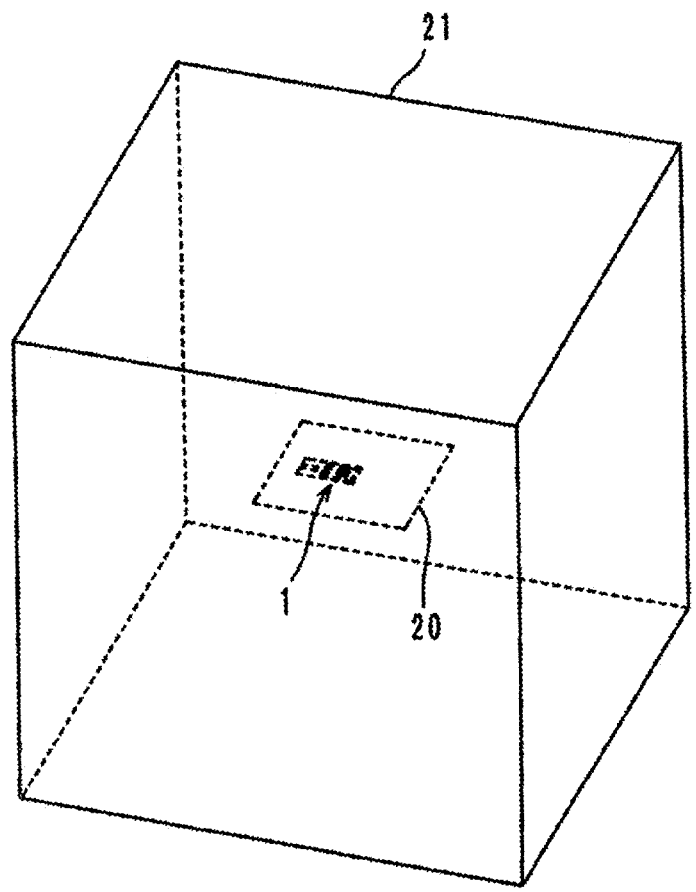
FIG. 9 is a perspective view illustrating a model in which the first preferred embodiment is disposed in water.

In addition, in order to maintain a good appearance of the article, the electromagnetic coupling module 1 and the dielectric film 20 may be incorporated into the dielectric body, as shown in FIG. 9. Even in such a case, the dielectric body functions as a radiator, as in the case of FIG. 5.

First Example of Electromagnetic Coupling Module

Figure 10:
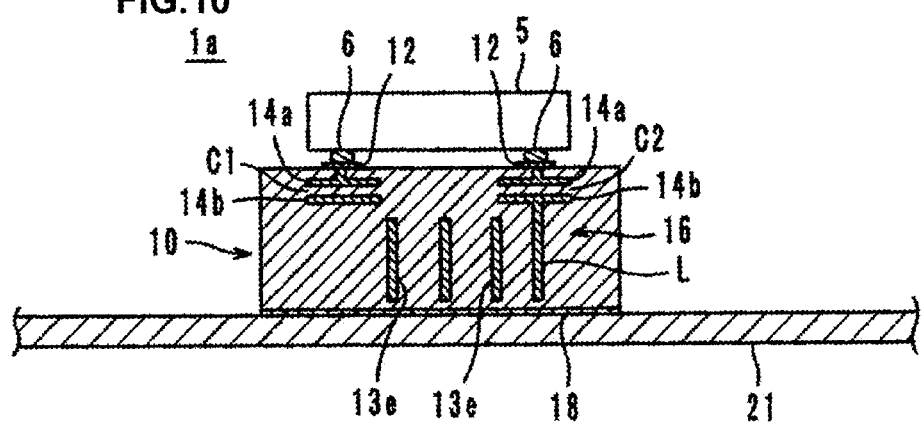
FIG. 10 is a cross-sectional view of the first example of the electromagnetic coupling module.

As shown in FIG. 10, an electromagnetic coupling module 1a, which is a first example, includes a wireless IC chip 5 and a feed circuit board 10 having the wireless IC chip 5 mounted on the upper surface thereof. The electromagnetic coupling module 1a is bonded to a dielectric body 21, such as a PET bottle 20' preferably using an adhesive agent 18, for example. The wireless IC chip 5 preferably includes a clock circuit, a logic circuit, and a memory circuit. The wireless IC chip 5 stores necessary information therein. The wireless IC chip 5 is electrically conductively connected to a feed circuit 16 included in the feed circuit board 10.

The feed circuit 16 defines a circuit to supply a transmission signal and a reception signal having predetermined frequencies to the dielectric body 21 functioning as a radiator and/or defines a circuit to select a reception signal having a predetermined frequency from among signals received by the dielectric body 21 and supply the selected signal to the wireless IC chip 5. The feed circuit 16 preferably includes a resonant circuit that resonates at the frequencies of the transmission signal and the reception signal.

Figure 11:
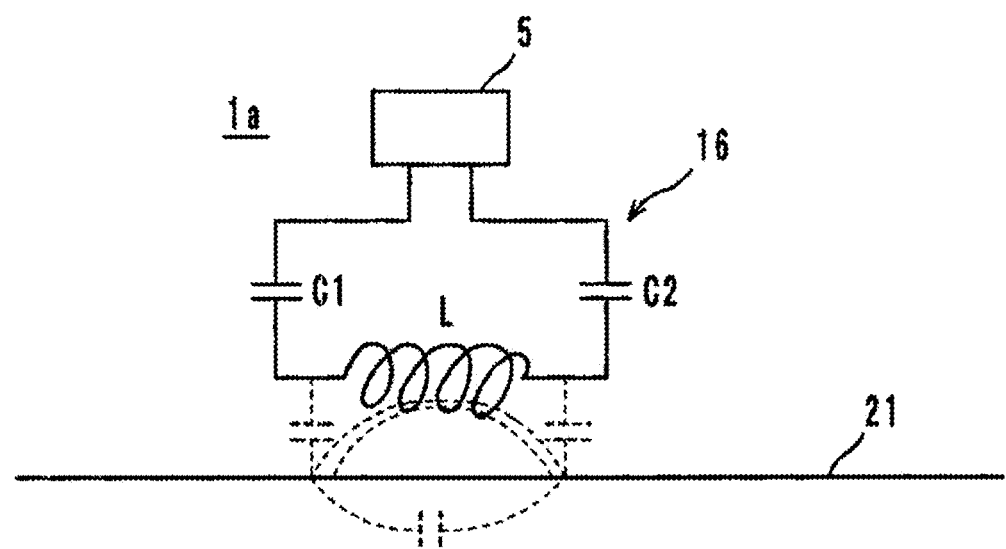
FIG. 11 is an equivalent circuit diagram of the first example.
Figure 12:
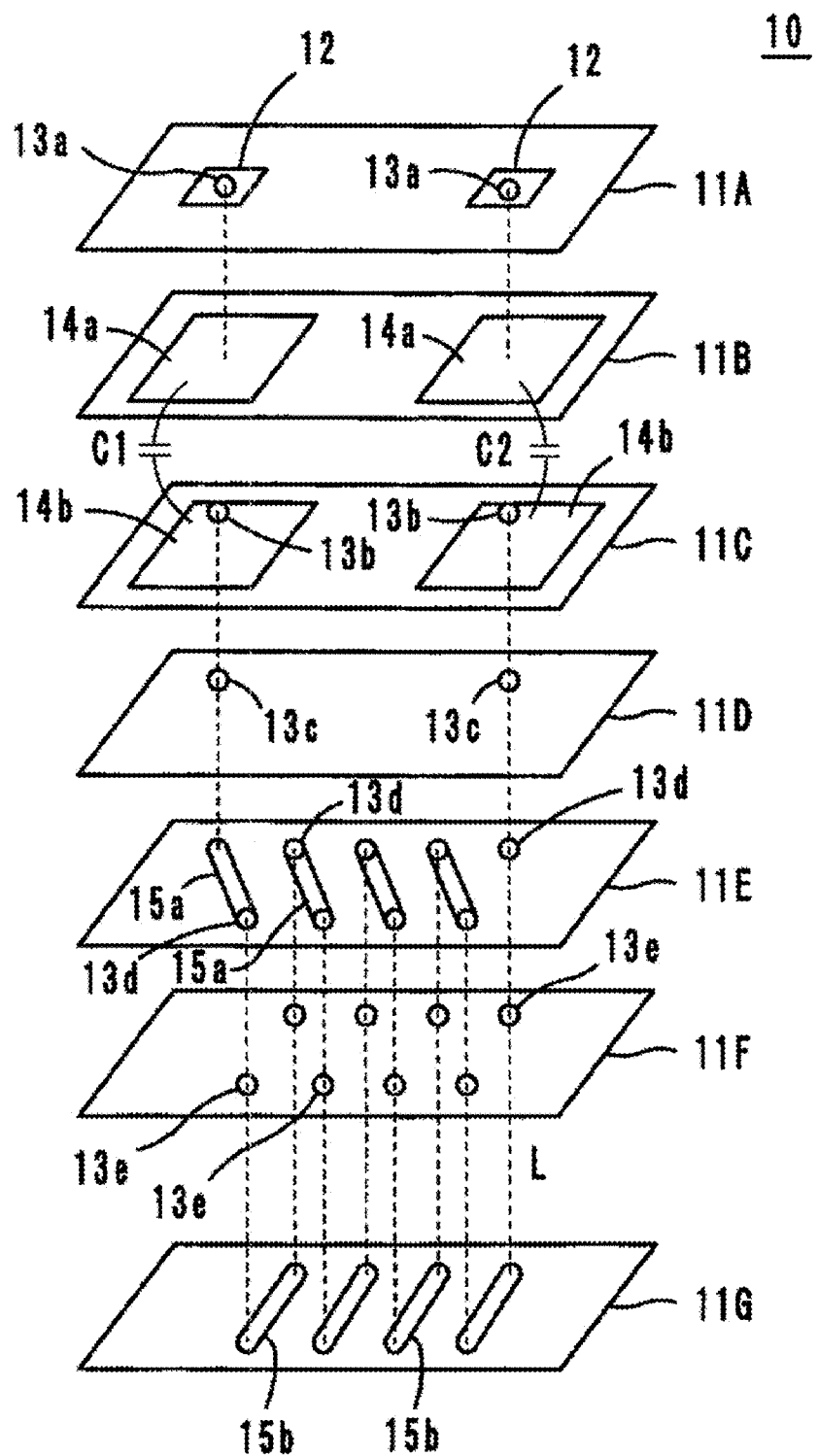
FIG. 12 is an exploded perspective view illustrating a feed circuit board of the first example.

As shown in FIGS. 10 and 11, the feed circuit board 10 includes the feed circuit 16 defined by a lumped constant LC series resonant circuit. The lumped constant LC series resonant circuit preferably includes a helical inductance element L and capacitance elements C1 and C2. More specifically, as shown in FIG. 12, which is an exploded perspective view of the feed circuit board 10, the feed circuit board 10 is preferably formed by stacking, pressing, and sintering ceramic sheets 11A to 11G, which are made of dielectric materials. The sheet 11A includes connection electrodes 12 and via hole conductors 13a provided therein. The sheet 11B includes capacitor electrodes 14a provided thereon. The sheet 11C includes capacitor electrodes 14b provided thereon and via hole conductors 13b provided therein. The sheet 11D includes via hole conductors 13c provided therein. The sheet 11E includes inductor electrodes 15a provided thereon and via hole conductors 13d provided therein. The sheet 11F (at least one) includes via hole conductors 13e provided therein. The sheet 11G includes inductor electrodes 15b provided thereon. Note that each of the ceramic sheets 11A to 11G may preferably be a sheet made of a magnetic ceramic material, for example. The feed circuit board 10 can be easily manufactured using an existing manufacturing procedure of a multilayer substrate, such as a sheet lamination method or a thick film printing method, for example.

By stacking the above-described sheets 11A to 11G, the helical inductance element L and the capacitance elements C1 and C2 are formed. The helical inductance element L has a helical or substantially helical winding axis which is parallel or substantially parallel to the bonding surfaces of the electromagnetic coupling module 1 and the dielectric body 21. The capacitor electrodes 14b are connected to either end of the helical inductance element L. Each of the capacitor electrodes 14a is connected to one of the connection electrodes 12 via one of the via hole conductors 13a. Thus, the capacitance elements C1 and C2 are formed. The substrate-side connection electrodes 12 are preferably electrically connected to chip-side electrodes (not shown) of the wireless IC chip 5 using solder bumps 6, for example.

That is, among elements of the feed circuit, a capacitance is generated between electrode portions of the helical inductance element L, which is defined by a coil-shaped electrode, facing the dielectric body 21 via the dielectric body 21 (e.g., between one end and the other end of a portion of the coil-shaped electrode facing the dielectric body 21). Due to this capacitance, a magnetic field is generated in the dielectric body 21. The magnetic field propagates to outside the dielectric body 21. Thus, a signal can be transmitted from the electromagnetic coupling module 1a. In addition, an electric field component of a signal transmitted from a reader/writer propagates into the dielectric body 21. Due to the electric field, capacitance is generated between one end portion and the other end portion of the coil-shaped electrode. Thus, the signal is received by the feed circuit board 10.

An example of the sizes of the components is as follows: the thickness of the wireless IC chip 5 is preferably about 50 μm to about 100 μm, the thickness of the solder bumps 6 is preferably about 20 μm, the thickness of the feed circuit board 10 is preferably about 200 μm to about 500 μm, and the thickness of the adhesive agent 18 is preferably about 0.1 μm to about 10 μm. In addition, a variety of the sizes (dimensions) of the wireless IC chip 5 may be employed, such as about 0.4 mm by about 0.4 mm or about 0.9 mm by about 0.8 mm, for example. The size (dimensions) of the feed circuit board 10 can be selected from among sizes between the size of the wireless IC chip 5 and a size of about 3 mm by about 3 mm.

Figure 13A:
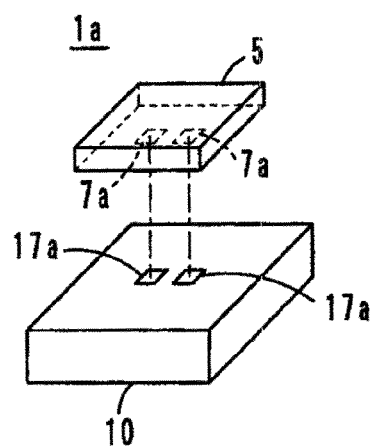
FIGS. 13A and 13B are perspective views illustrating connections between a wireless IC chip and the feed circuit board.
Figure 13B:
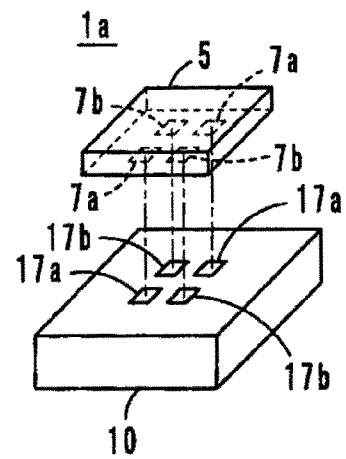

FIGS. 13A and 13B illustrate connections between the wireless IC chip 5 and the feed circuit board 10. In FIG. 13A, a pair of antenna terminals 7a is mounted on the back surface of the wireless IC chip 5, and a pair of antenna terminals 17a is provided on the front surface of the feed circuit board 10. FIG. 13B illustrates another connection example in which a pair of implementation terminals 7b is provided on the back surface of the wireless IC chip 5 in addition to the pair of antenna terminals 7a, and a pair of implementation terminals 17b is mounted on the front surface of the feed circuit board 10 in addition to the pair of antenna terminals 17a. However, the implementation terminals 17b of the feed circuit board 10 are terminated, and therefore, the implementation terminals 17b are not connected to any other elements of the feed circuit board 10.

FIG. 11 is an equivalent circuit diagram of the electromagnetic coupling module 1a. The electromagnetic coupling module 1a receives a high-frequency signal (e.g., a UHF band signal) radiated from a reader/writer (not shown) using the dielectric body 21. Thereafter, the electromagnetic coupling module 1a causes the feed circuit 16 (the LC series resonant circuit including the inductance element L and the capacitance elements C1 and C2) electromagnetically coupled with the dielectric body 21 to resonate. In this manner, the electromagnetic coupling module 1a supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance element L thereof to the dielectric body 21 using electromagnetic coupling. Thus, the transmission signal is transmitted and transferred from the dielectric body 21 to the reader/writer.

Note that the feed circuit 16 is coupled with the dielectric body 21 primarily via electric field coupling. However, magnetic field coupling may also be present. As used herein, the term "electromagnetic field coupling" refers to coupling using an electric field and/or a magnetic field.

In the electromagnetic coupling module 1a of the first example, the wireless IC chip 5 is electrically conductively connected onto the feed circuit board 10 including the feed circuit 16. The feed circuit board 10 preferably has dimensions substantially the same as those of the wireless IC chip 5. In addition, the feed circuit board 10 is rigid. Accordingly, the wireless IC chip 5 can be precisely positioned and mounted on the feed circuit board 10. Furthermore, since the feed circuit board 10 is made of a ceramic material having a heat resistance, the wireless IC chip 5 can preferably be soldered onto the feed circuit board 10. In addition, a self alignment function of a solder reflow can preferably be used.

For the feed circuit 16, the resonant frequency characteristic is determined by the resonant circuit including the inductance element L and the capacitance elements C1 and C2. In practice, the resonant frequency of a signal radiated from the dielectric body 21 is the same or substantially the same as the self-resonant frequency of the feed circuit 16. The maximum gain of the signal is determined by at least one of the size and shape of the feed circuit 16, the distance between the feed circuit 16 and the dielectric body 21, and a medium present between the feed circuit 16 and the dielectric body 21.

Furthermore, the winding axis of the coil-shaped electrode defining the helical inductance element L is preferably parallel or substantially parallel to the bonding surfaces of the electromagnetic coupling module 1a and the dielectric body 21. Accordingly, the center frequency is not advantageously varied. Still furthermore, since the capacitance elements C1 and C2 are disposed between the wireless IC chip 5 and the inductance element L, a low-frequency surge can be reduced using the elements C1 and C2. Therefore, the wireless IC chip 5 can be protected from surge. In addition, since the feed circuit board 10 is a rigid multilayer board, the wireless IC chip 5 can be easily soldered.

Note that the resonant circuit may also preferably function as a matching circuit arranged to match the characteristic impedance of the input and output portion of the wireless IC chip 5 to the characteristic impedance of the dielectric body 21. Alternatively, the feed circuit board may preferably include a matching circuit that is different from the resonant circuit and that includes an inductance element and a capacitance element. If the resonant circuit also functions as a matching circuit, the design of the resonant circuit is complicated. When a matching circuit is provided separately from the resonant circuit, the resonant circuit and the matching circuit can be independently designed.

Second Example of Electromagnetic Coupling Module

Figure 14:
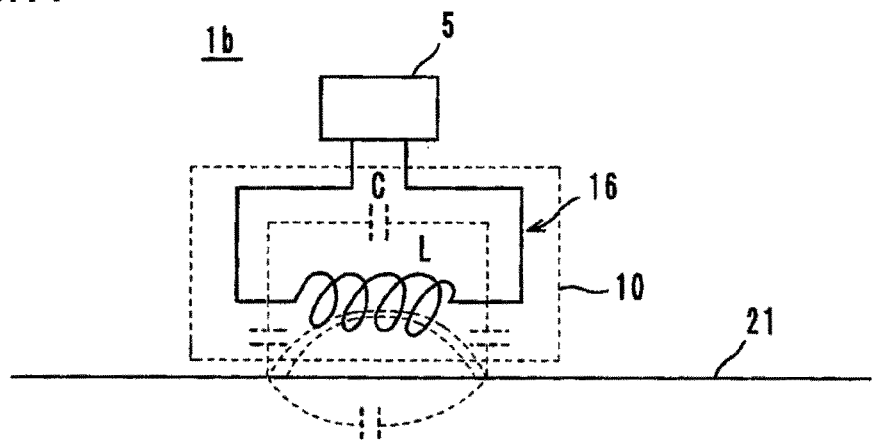
FIG. 14 is an equivalent circuit diagram of a second example of the electromagnetic coupling module.

As shown by an equivalent circuit in FIG. 14, an electromagnetic coupling module 1b, which is a second example, includes a feed circuit board 10 having a feed circuit 16 included therein. The feed circuit 16 is defined by an inductance element L that functions as a coil-shaped electrode. A capacitance element C of an LC parallel resonant circuit is provided by a floating capacitance (distributed constant capacitance) generated between coil-shaped electrodes of the inductance element L.

That is, even a single coil-shaped electrode can function as an LC parallel resonant circuit using an L component and a C component that is a floating capacitance between lines if the coil-shaped electrode has self resonance. Thus, the coil-shaped electrode can preferably define the feed circuit 16. As in the first example, in this second example, capacitance is generated between electrode portions of the coil-shaped electrode facing the dielectric body 21 (e.g., one end portion and the other end portion of the coil-shaped electrode) via the dielectric body 21. Due to the capacitance, an electric field is generated in the dielectric body 21. The generated electric field propagates in the dielectric body 21 and to outside the dielectric body 21. In this manner, a signal is transmitted.

Accordingly, the electromagnetic coupling module 1b receives a high-frequency signal (e.g., a UHF band signal) radiated from a reader/writer (not shown) using the dielectric body 21. Thereafter, the electromagnetic coupling module 1b causes the feed circuit 16 (the LC parallel resonant circuit including the inductance element L and the capacitance element C) electromagnetically coupled with the dielectric body 21 to resonate. In this manner, the electromagnetic coupling module 1b supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance element L thereof to the dielectric body 21 using electromagnetic coupling. Thus, the transmission signal is transmitted and transferred from the dielectric body 21 to the reader/writer.

Third Example of Electromagnetic Coupling Module

Figure 15:
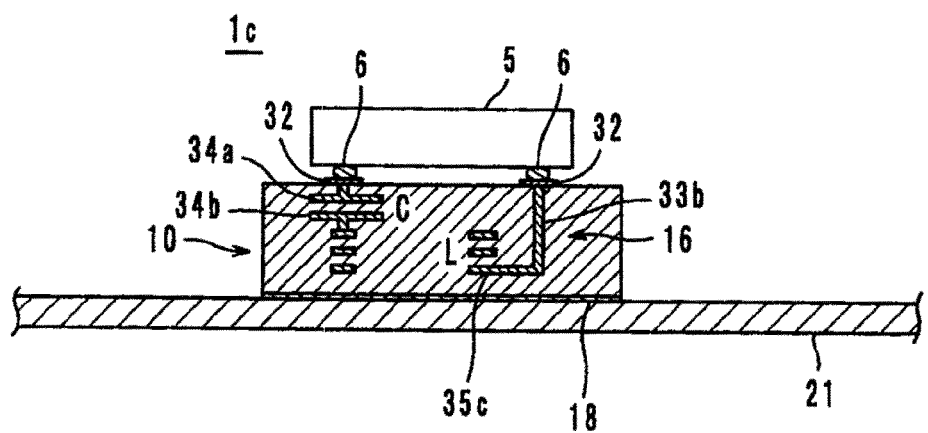
FIG. 15 is across-sectional view of a third example of the electromagnetic coupling module.
Figure 16:
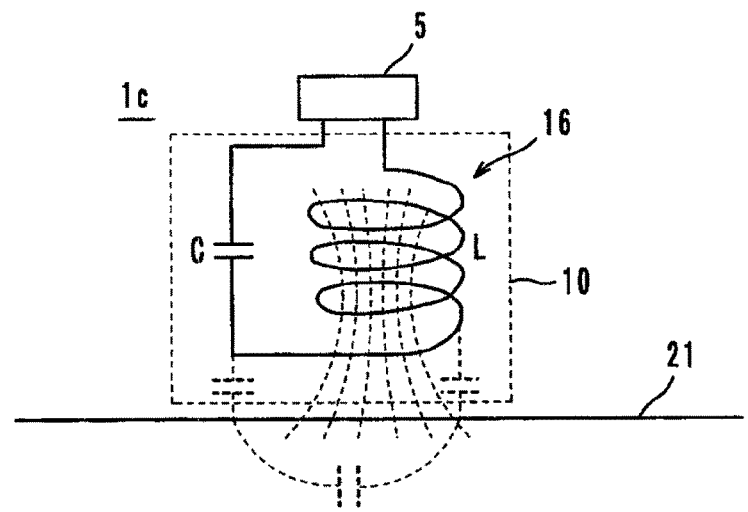
FIG. 16 is an equivalent circuit diagram of the third example of the electromagnetic coupling module.

As shown in FIG. 15, an electromagnetic coupling module 1c, which is a third example, includes a feed circuit board 10 having a feed circuit 16 included therein. The feed circuit 16 is defined by an LC series resonant circuit including an inductance element L and a capacitance element C. As shown in FIG. 16, a coil-shaped electrode defining the inductance element L has a winding axis perpendicular or substantially perpendicular to the bonding surfaces of the electromagnetic coupling module 1c and the dielectric body 21. The feed circuit 16 is electromagnetically coupled with the dielectric body 21.

Figure 17:
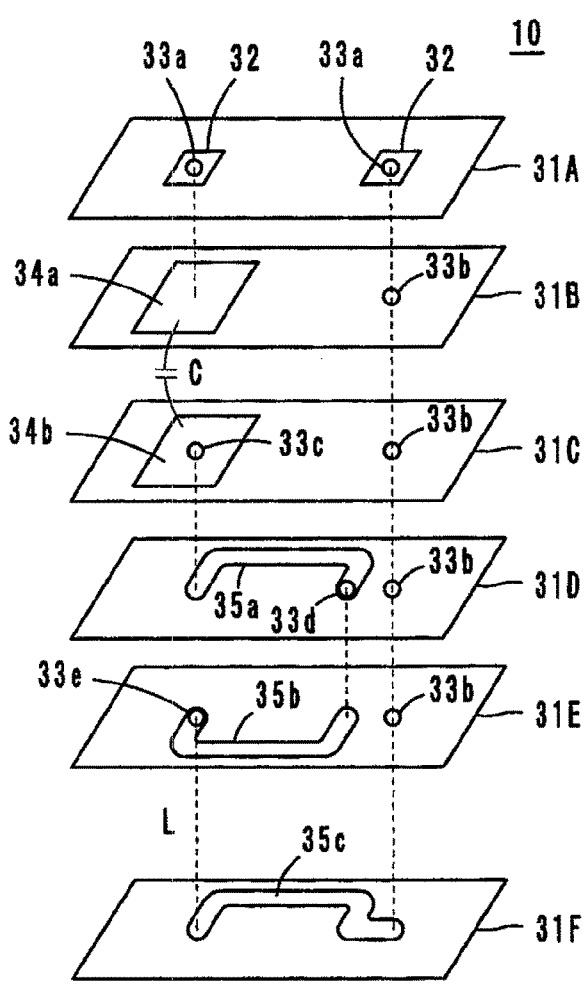
FIG. 17 is an exploded perspective view illustrating a feed circuit board of the third example.

More specifically, as shown in FIG. 17, the feed circuit board 10 is formed by stacking, pressing, and sintering dielectric ceramic sheets 31A to 31F. The sheet 31A includes connection electrodes 32 and via hole conductors 33a provided therein. The sheet 31B includes a capacitor electrode 34a and a via hole conductor 33b provided therein. The sheet 31C includes a capacitor electrode 34b and via hole conductors 33c and 33b provided therein. The sheet 31D (at least one) includes an inductor electrode 35a and via hole conductors 33d and 33b. The sheet 31E (at least one) includes an inductor electrode 35b and via hole conductors 33e and 33b provided therein. The sheet 31F includes an inductor electrode 35c.

By stacking the above-described sheets 31A to 31F, the inductance element L and the capacitance element C are formed. The inductance element L has a helical or substantially helical winding axis which is perpendicular or substantially perpendicular to the bonding surfaces of the electromagnetic coupling module 1c and the dielectric body 21. The capacitance element C is connected in series to the inductance element L. Thus, an LC series resonant circuit that functions as the feed circuit 16 is provided. The capacitor electrode 34a is connected to one of the connection electrodes 32 through one of the via hole conductors 33a and is further connected to the wireless IC chip 5 using a solder bump 6. One end of the inductance element L is connected to the other connection electrode 32 via the via hole conductors 33b and is further connected to the wireless IC chip 5 using a solder bump 6.

The operations and advantages of the third example are substantially the same as those of the first example. As in the first example, in the third example, capacitance is generated between one end portion and the other end portion of the electrode portion of the coil-shaped electrode facing the dielectric body 21 via the dielectric body 21. Due to the capacitance, an electric field is generated in the dielectric body 21. The generated electric field propagates in the dielectric body 21 and to outside the dielectric body 21. In this manner, a signal is transmitted.

That is, the electromagnetic coupling module 1c receives a high-frequency signal (e.g., a UHF band signal) radiated from a reader/writer (not shown) using the dielectric body 21. Thereafter, the electromagnetic coupling module 1c causes the feed circuit 16 (the LC series resonant circuit including the inductance element L and the capacitance element C) electromagnetically coupled with the dielectric body 21 to resonate. In this manner, the electromagnetic coupling module 1c supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance element L thereof to the dielectric body 21 using electromagnetic coupling. Thus, the transmission signal is transmitted and transferred from the dielectric body 21 to the reader/writer.

In particular, in the third example, since the coil-shaped electrode is arranged so that the winding axis thereof is perpendicular or substantially perpendicular to the bonding surfaces of the electromagnetic coupling module 1c and the dielectric body 21, a magnetic flux component applied to the dielectric body 21 is increased, and therefore, the transmission efficiency of a signal is increased and the gain is advantageously increased.

Fourth Example of Electromagnetic Coupling Module

Figure 18:
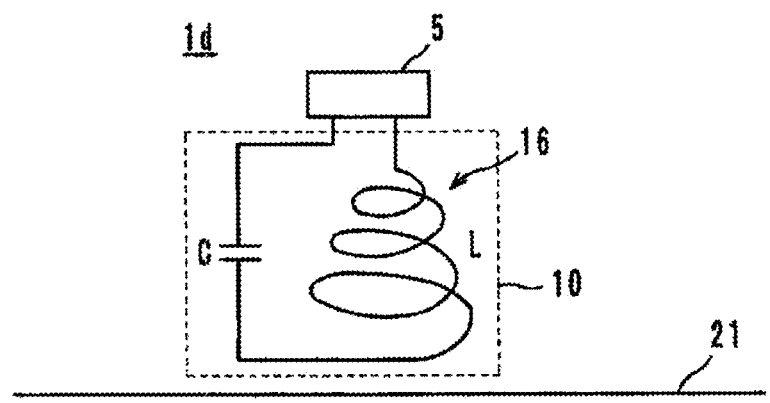
FIG. 18 is an equivalent circuit diagram of a fourth example of the electromagnetic coupling module.

As shown by an equivalent circuit in FIG. 18, in an electromagnetic coupling module 1d, which is a fourth example, the width of the winding (the coil diameter) of the coil-shaped electrode of the inductance element L illustrated in the third example is gradually increased towards the bonding surfaces of the electromagnetic coupling module 1d and the dielectric body 21. The other structures are substantially the same as those of the third example.

The operations and advantages of the fourth example are substantially the same as those of the third example. In addition, since the width of the winding (the coil diameter) of the coil-shaped electrode of the inductance element L illustrated in the third example is gradually increased towards the bonding surfaces of the electromagnetic coupling module 1d and the dielectric body 21, the transmission efficiency of a signal can be increased.

Fifth Example of Electromagnetic Coupling Module

Figure 19:
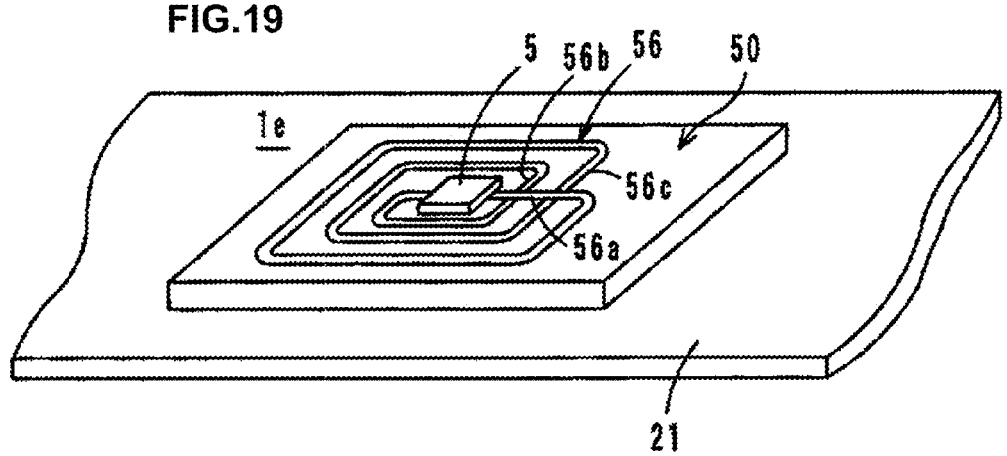
FIG. 19 is a perspective view of a fifth example of the electromagnetic coupling module.

As shown in FIG. 19, an electromagnetic coupling module 1e, which is a fifth example, includes a coil-shaped electrode disposed on a ceramic or heat-resistant resin rigid feed circuit board 50. That is, the electromagnetic coupling module 1e includes a feed circuit 56 including a spiral inductance element disposed on the single-layer board 50. The ends of the feed circuit 56 are directly connected to each other via the wireless IC chip 5 and solder bumps. The feed circuit board 50 is bonded to the dielectric body 21 using an adhesive agent. In addition, the feed circuit 56 includes inductor electrodes 56a, 56b, and 56c. The inductor electrode 56a preferably intersects with each of the inductor electrodes 56b and 56c. However, the inductor electrode 56a is separated from each of the inductor electrodes 56b and 56c via an insulating film (not shown).

In the fifth example, the feed circuit 56 defines an LC parallel resonant circuit that uses a floating capacitance generated between the spirally wound inductor electrodes defining a capacitance component. In addition, the feed circuit board 50 is a single-layer board made a dielectric material or a magnetic material, for example.

In the electromagnetic coupling module 1e of the fifth example, the feed circuit 56 is coupled with the dielectric body 21 via an electromagnetic field. Accordingly, as in the above-described examples, the electromagnetic coupling module 1e receives, using the dielectric body 21, a high-frequency signal radiated from a reader/writer. Thereafter, the electromagnetic coupling module 1e causes the feed circuit 56 to resonate. In this manner, the electromagnetic coupling module 1e supplies only a reception signal in a predetermined frequency range to the wireless IC chip 5. On the other hand, the feed circuit 56 retrieves predetermined energy from the reception signal. Thereafter, the feed circuit 56 retrieves an information signal stored in the wireless IC chip 5 using the energy as a driving source and converts the signal so that the signal matches a predetermined frequency. Subsequently, the feed circuit 56 sends a transmission signal from the inductance element thereof to the dielectric body 21 using electromagnetic coupling. Thus, the transmission signal is transmitted and transferred from the dielectric body 21 to the reader/writer.

Since, as in the first example, the wireless IC chip 5 is disposed on the feed circuit board 50 that is rigid and that has a relatively small area, the wireless IC chip 5 can be precisely positioned. In addition, the wireless IC chip 5 can be connected to the feed circuit board 50 using a solder bump.

Sixth Example of Electromagnetic Coupling Module

Figure 20:
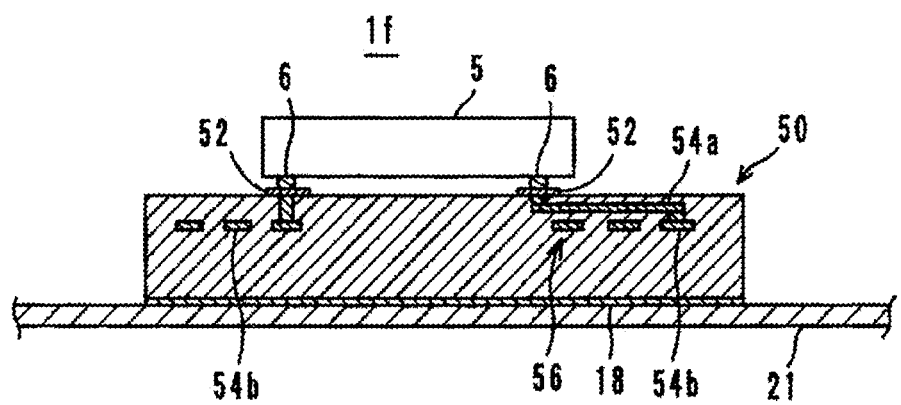
FIG. 20 is a cross-sectional view of a sixth example of the electromagnetic coupling module.
Figure 21:
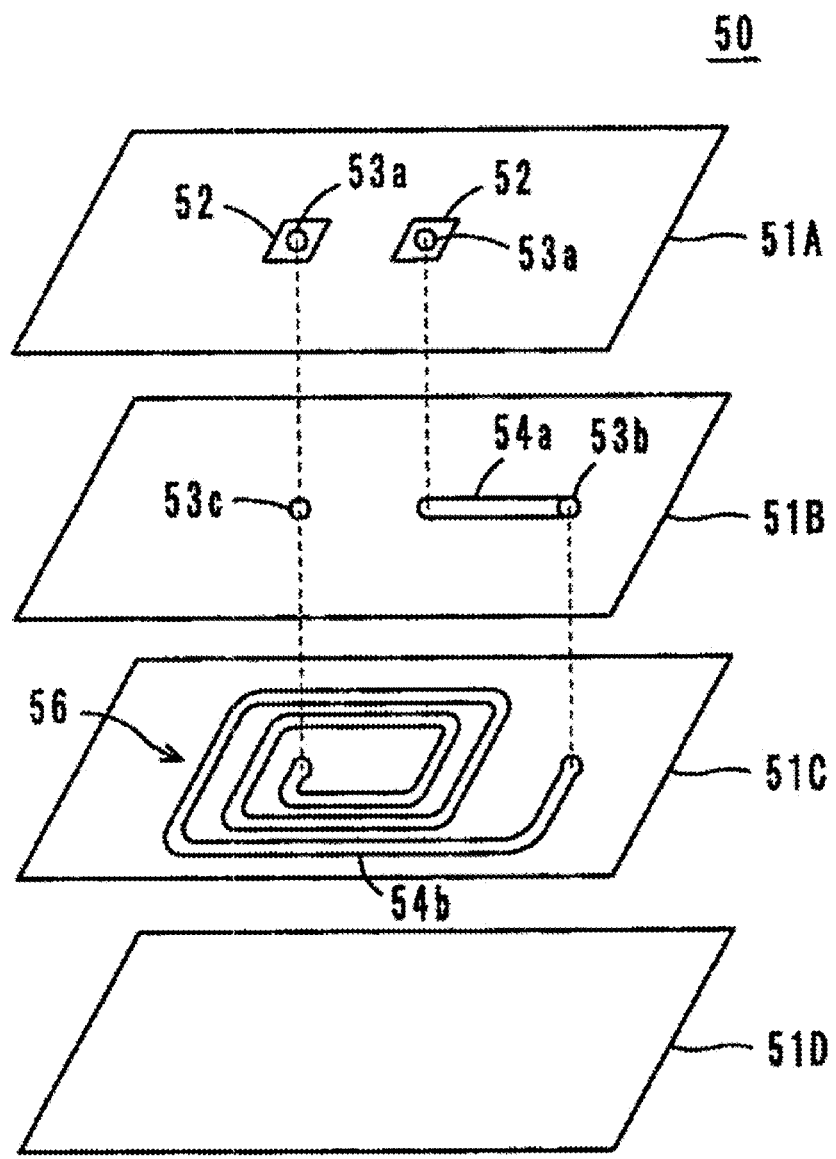
FIG. 21 is an exploded perspective view illustrating a feed circuit board of the sixth example.

As shown in FIG. 20, an electromagnetic coupling module if, which is a sixth example, includes a feed circuit board 50 having a coil-shaped electrode of a feed circuit 56 included therein. As shown in FIG. 21, the feed circuit board 50 is preferably formed by stacking, pressing, and sintering dielectric ceramic sheets 51A to 51D. The sheet 51A includes connection electrodes 52 and via hole conductors 53a provided therein. The sheet 51B includes an inductor electrode 54a and via hole conductors 53b and 53c provided therein. The sheet 51C includes an inductor electrode 54b provided therein. The sheet 51D (at least one) includes no components.

In the coil-shaped electrode, by stacking the above-described sheets 51A to 51D, the feed circuit board 50 including the feed circuit 56 can be obtained. The feed circuit 56 includes a resonant circuit including the spirally wound inductance element and a capacitance component defined by a floating capacitance generated between lines of the spiral electrodes. The connection electrodes 52 located at either end of the feed circuit 56 are connected to the wireless IC chip 5 via the solder bumps 6. The operations and advantages of the sixth example are substantially the same as those of the above-described fifth example.

Seventh Example of Electromagnetic Coupling Module

Figure 22:
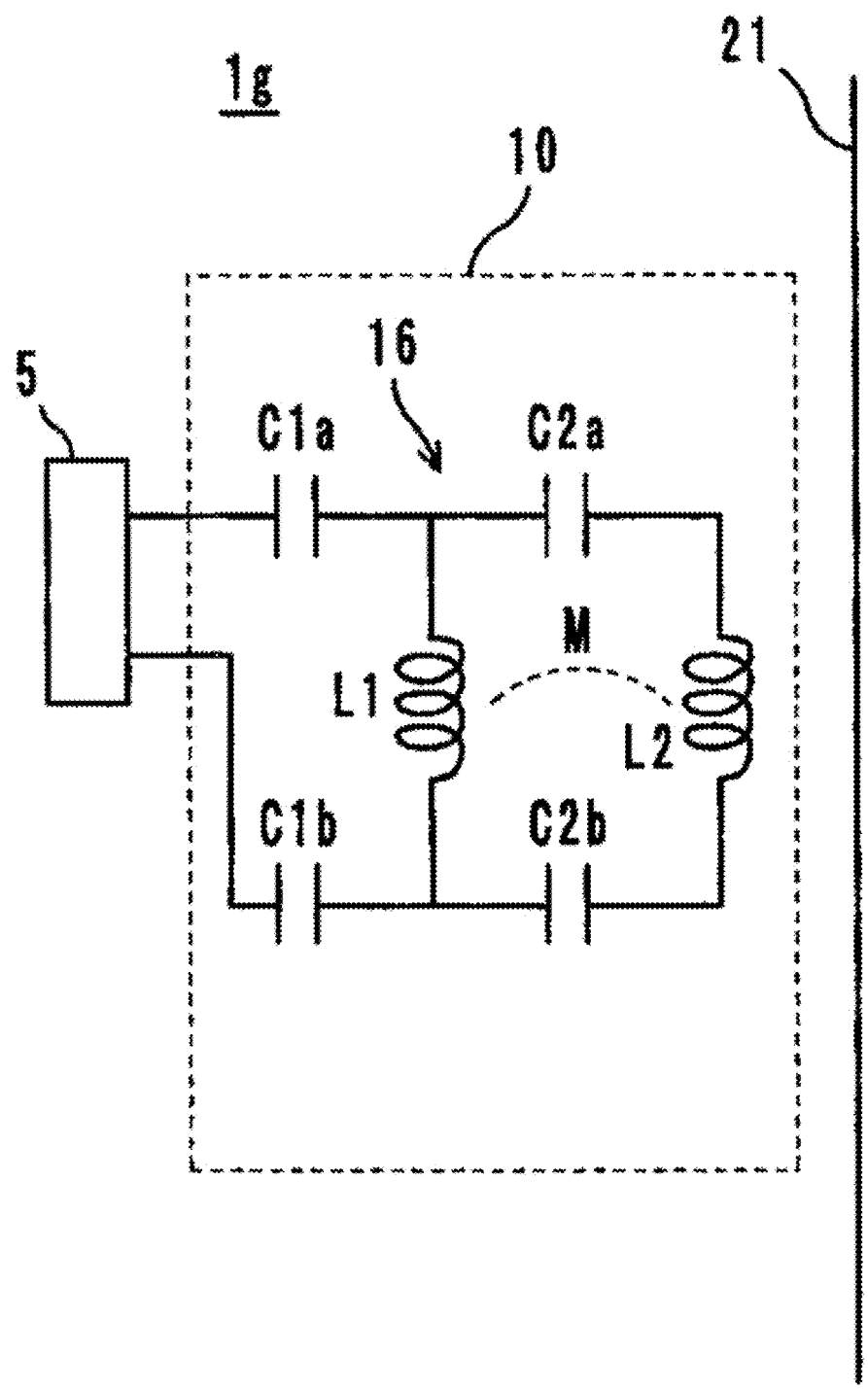
FIG. 22 is an equivalent circuit diagram of a seventh example of the electromagnetic coupling module.

As shown by an equivalent circuit in FIG. 22, in an electromagnetic coupling module 1g, which is a seventh example, a feed circuit 16 includes inductance elements L1 and L2 that are magnetically coupled with each other. The inductance element L1 is connected to the wireless IC chip 5 via capacitance elements C1a and C1b. In addition, the inductance element L1 is connected to the inductance element L2 in parallel via capacitance elements C2a and C2b. That is, the feed circuit 16 includes an LC series resonant circuit including the inductance element L1 and the capacitance elements C1a and C1b and an LC series resonant circuit including the inductance element L2 and the capacitance elements C2a and C2b. The two resonant circuits are coupled with each other via a magnetic field indicated by mutual inductance M shown in FIG. 22. Furthermore, the two inductance elements L1 and L2 are coupled with the dielectric body 21 via an electromagnetic field.

Figure 23:
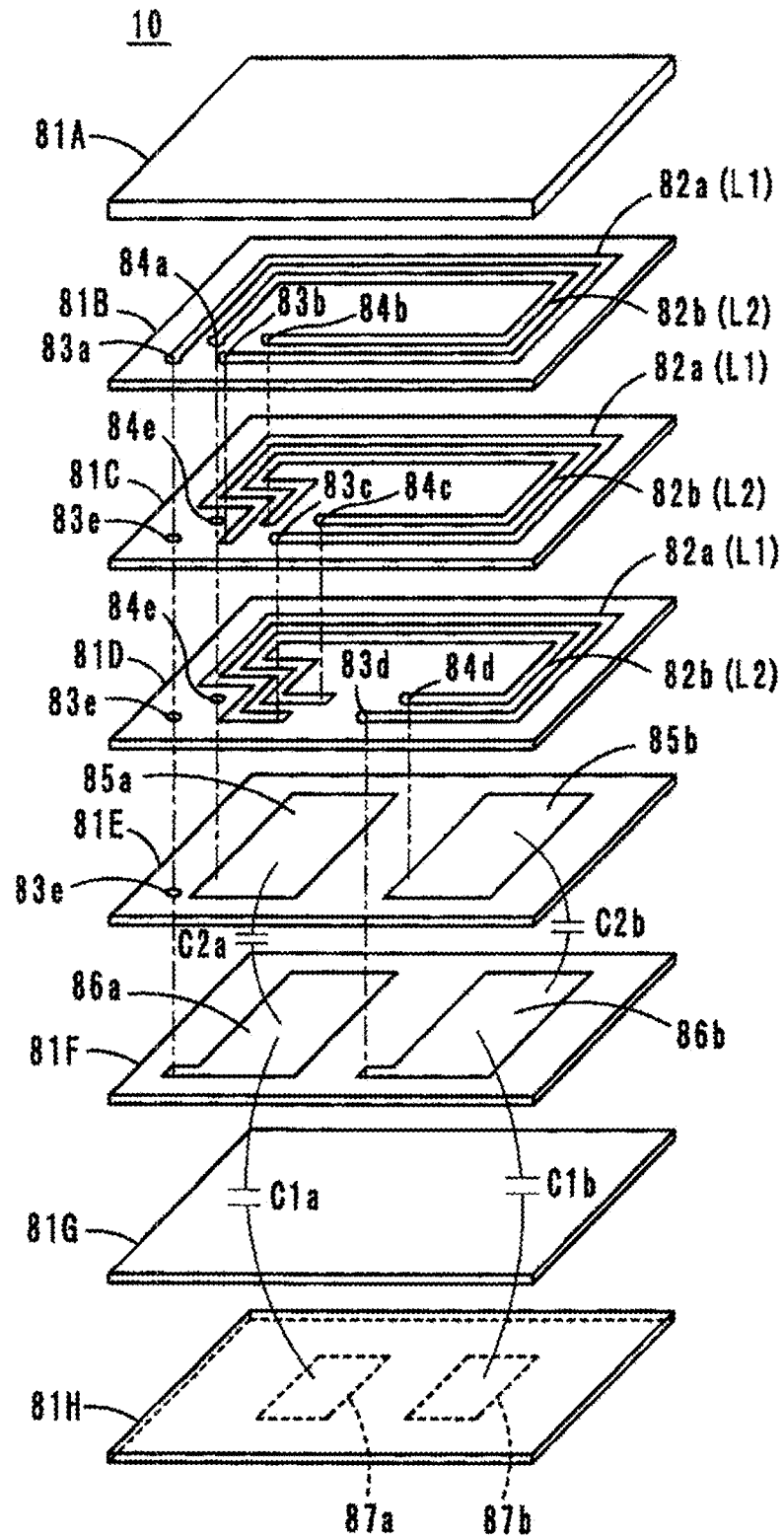
FIG. 23 is an exploded perspective view illustrating a feed circuit board of the seventh example.

More specifically, as shown in FIG. 23, the feed circuit board 10 is preferably formed by stacking, pressing, and sintering dielectric ceramic sheets 81A to 81H. The sheet 81A includes no components provided therein. The sheet 81B includes inductor electrodes 82a and 82b and via hole conductors 83a, 83b, 84a, and 84b provided therein. The sheet 81C includes inductor electrodes 82a and 82b and via hole conductors 83c, 84c, 83e, and 84e provided therein. The sheet 81D includes the inductor electrodes 82a and 82b, via hole conductors 83d and 84d, and the via hole conductors 83e and 84e provided therein. The sheet 81E includes capacitor electrodes 85a and 85b and the via hole conductor 83e provided therein. The sheet 81F includes capacitor electrodes 86a and 86b provided therein. The sheet 81G includes no components provided therein. The sheet 81H includes capacitor electrodes 87a and 87b provided on the back surface thereof.

By stacking the above-described sheets 81A to 81H, the inductor electrodes 82a are connected via the via hole conductors 83b and 83c so that the inductance element L1 is provided. In addition, the inductor electrodes 82b are connected via the via hole conductors 84b and 84c so that the inductance element L2 is provided. The capacitance element C1a is defined by the capacitor electrodes 86a and 87a. The capacitor electrode 86a is connected to one end of the inductance element L1 via the via hole conductor 83e. The capacitance element C1b is defined by the capacitor electrodes 86b and 87b. The capacitor electrode 86b is connected to the other end of the inductance element L1 via the via hole conductor 83d. Furthermore, the capacitance element C2a is defined by the capacitor electrodes 85a and 86a. The capacitor electrode 85a is connected to one end of the inductance element L2 via the via hole conductor 84e. The capacitance element C2b is defined by the capacitor electrodes 85b and 86b. The capacitor electrode 85b is connected to the other end of the inductance element L2 via the via hole conductor 84d.

The operations and advantages of the seventh example are substantially the same as those of the first example. That is, the electromagnetic coupling module 1g receives a high-frequency signal (e.g., a UHF band signal) radiated from a reader/writer (not shown) using the dielectric body 21. Thereafter, the electromagnetic coupling module 1g causes the feed circuit 16 (the LC series resonant circuit including the inductance element L1 and the capacitance elements C1a and C1b and the LC series resonant circuit including the inductance element L2 and the capacitance elements C2a and C2b) electromagnetically coupled with the dielectric body 21 to resonate. In this manner, the electromagnetic coupling module 1g supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance elements L1 and L2 thereof to the dielectric body 21 using electric field coupling. Thus, the transmission signal is transmitted and transferred from the dielectric body 21 to the reader/writer.

Figure 24:
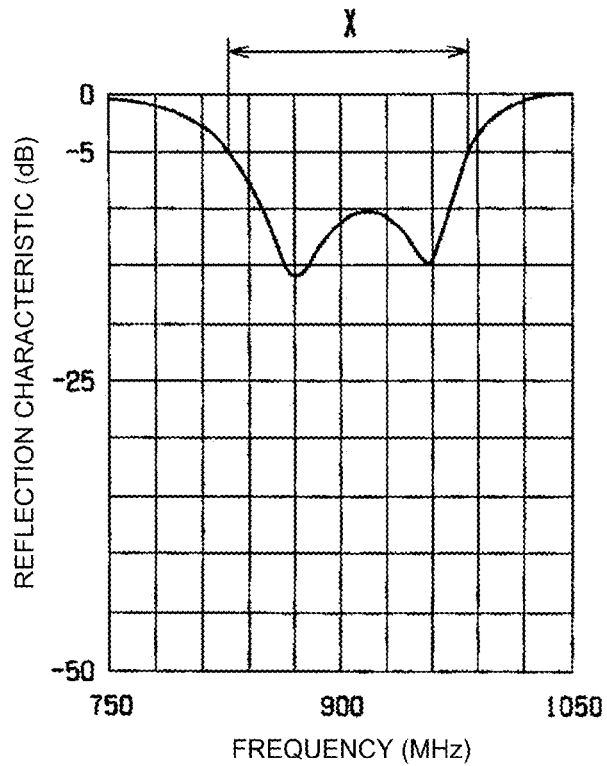
FIG. 24 is a graph illustrating a reflection characteristic of the seventh example.

In particular, in the seventh example, as shown by the reflection characteristic in a band width X in FIG. 24, the frequency range is increased. This is because the feed circuit 16 includes a plurality of LC resonant circuits, each including the inductance elements L1 and L2 that are highly magnetically coupled with each other. In addition, since the capacitance elements C1a and C1b are disposed between the wireless IC chip 5 and the inductance element L1, surge resistance can be improved.

Eighth Example of Electromagnetic Coupling Module

Figure 25:
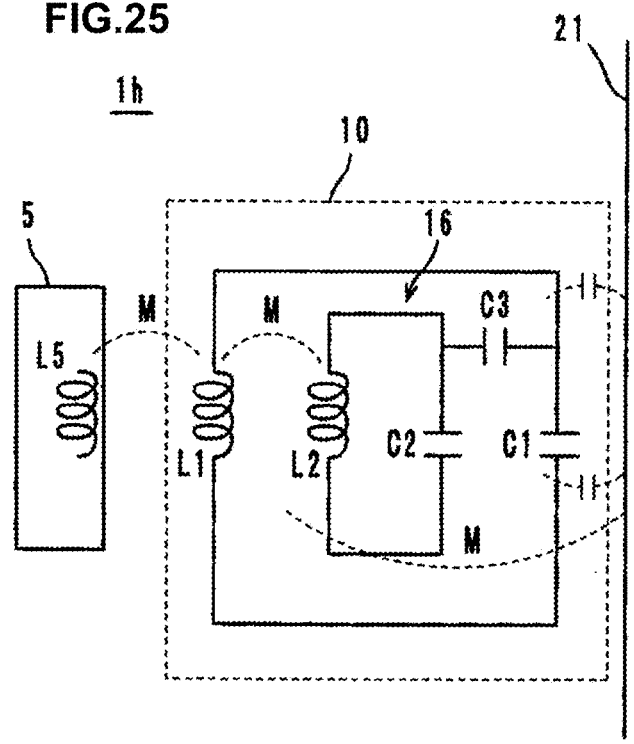
FIG. 25 is an equivalent circuit diagram of an eighth example of the electromagnetic coupling module.

As shown by an equivalent circuit in FIG. 25, in an electromagnetic coupling module 1h, which is an eighth example, a feed circuit 16 includes inductance elements L1 and L2 that are tightly coupled with each other via a magnetic field. The inductance element L1 is coupled to an inductance element L5 provided to the wireless IC chip 5 via a magnetic field. The inductance element L2 and a capacitance element C2 define an LC parallel resonant circuit. In addition, the capacitance element C1 is coupled to the dielectric body 21 via an electric field. An additional capacitance element C3 is disposed between the capacitance elements C1 and C2.

Figure 26:
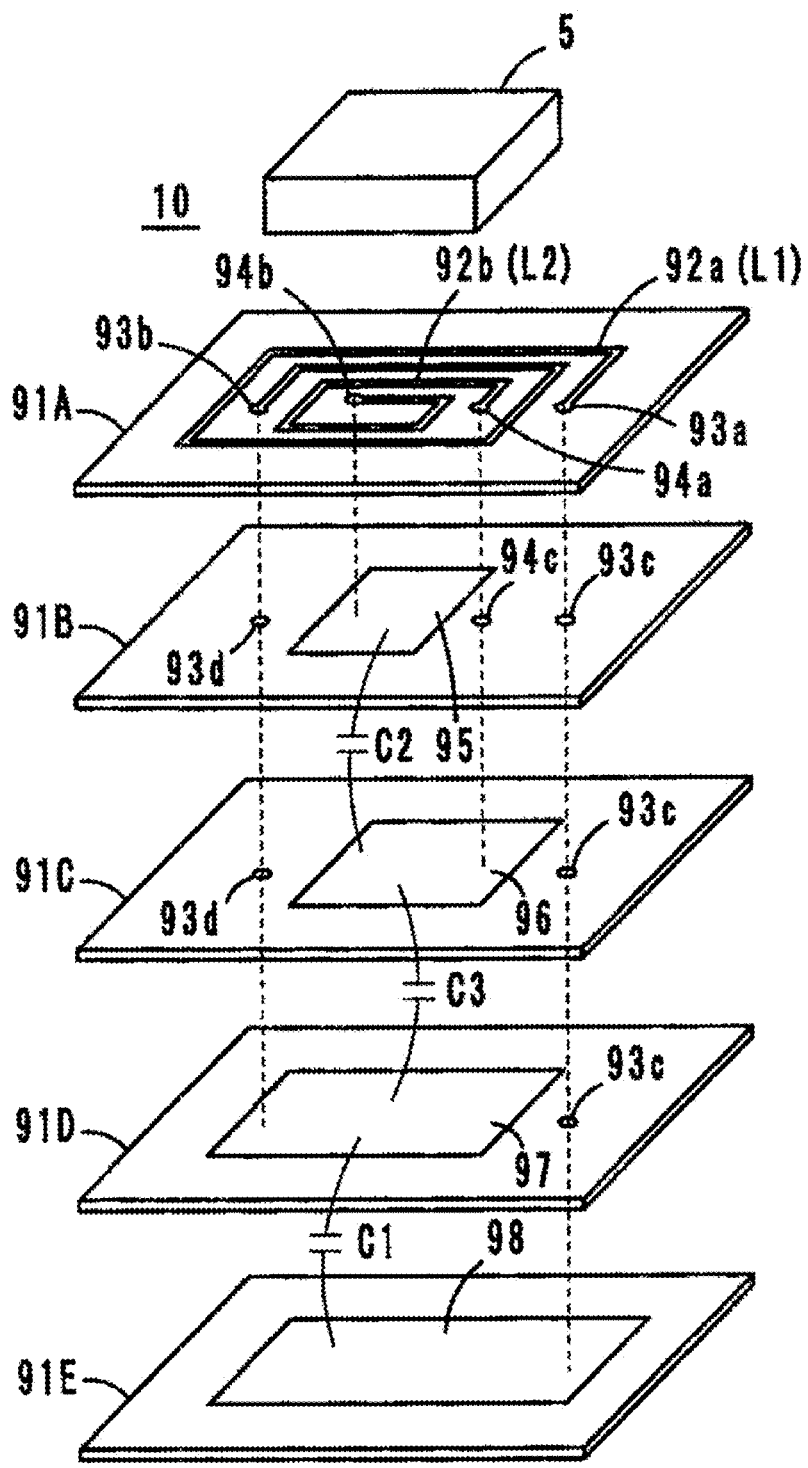
FIG. 26 is an exploded perspective view illustrating a feed circuit board of the eighth example.

More specifically, as shown in FIG. 26, the feed circuit board 10 is formed by stacking, pressing, and sintering ceramic sheets 91A to 91E, which are made of a dielectric material. The sheet 91A includes inductor electrodes 92a and 92b and via hole conductors 93a, 93b, 94a, and 94b provided therein. The sheet 91B includes a capacitor electrode 95 and via hole conductors 93c, 93d, and 94c provided therein. The sheet 91C includes a capacitor electrode 96 and the via hole conductors 93c and 93d provided therein. The sheet 91D includes a capacitor electrode 97 and the via hole conductor 93c provided therein. The sheet 91E includes a capacitor electrode 98 provided therein.

By stacking the above-described sheets 91A to 91E, the inductor electrode 92a forms the inductance element L1. The inductor electrode 92b defines the inductance element L2. The capacitor electrodes 97 and 98 define the capacitance element C1. One end of the inductance element L1 is connected to the capacitor electrode 98 via the via hole conductors 93a and 93c, while the other end is connected to the capacitor electrode 97 via the via hole conductors 93b and 93d. The capacitor electrodes 95 and 96 form the capacitance element C2. One end of the inductance element L2 is connected to the capacitor electrode 96 via the via hole conductors 94a and 94c, while the other end is connected to the capacitor electrode 95 via the via hole conductor 94b. In addition, the capacitor electrodes 96 and 97 form the capacitance element C3.

Figure 27A:
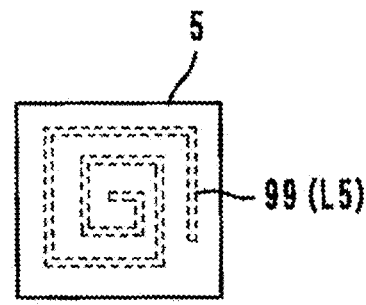
FIGS. 27A and 27B illustrate a wireless IC chip of the eighth example, where
Figure 27B:
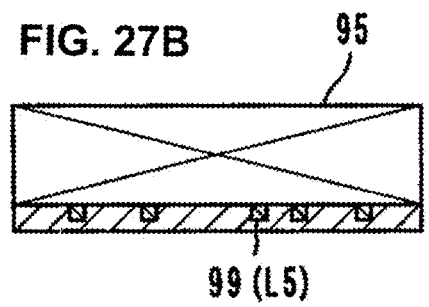

Furthermore, as shown in FIG. 27, a coil-shaped electrode 99 serving as a chip-side electrode is provided on the back surface of the wireless IC chip 5. The coil-shaped electrode 99 serves as the inductance element L5. Note that a protective film made of, for example, a resin is coated on a surface of the coil-shaped electrode 99. In this manner, the inductance elements L1 and L2, each defined by a coil-shaped electrode functioning as a board-side electrode, are coupled to the coil-shaped electrode 99 via a magnetic field.

The operations and advantages of the eighth example are substantially the same as those of the first example. Unlike the above-described examples, in the eighth example, since the capacitor electrode 98 is disposed in close proximity to the dielectric body 21, the value of a capacitance generated between the dielectric body 21 and the capacitor electrode 98 is increased, and therefore, an electric field occurring in the dielectric body 21 is increased. Accordingly, the transmission efficiency of a signal can be improved.

That is, the electromagnetic coupling module 1h receives a high-frequency signal (e.g., a UHF band signal) radiated from a reader/writer (not shown) using the dielectric body 21. Thereafter, the electromagnetic coupling module 1h causes the feed circuit 16 (the LC series resonant circuit including the inductance element L2 and the capacitance element C2) electromagnetically coupled with the dielectric body 21 to resonate. In this manner, the electromagnetic coupling module 1h supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal to the dielectric body 21 using electric field coupling and magnetic field coupling. Thus, the transmission signal is transmitted and transferred from the dielectric body 21 to the reader/writer. The feed circuit 16 is coupled to the wireless IC chip 5 via a magnetic field using the inductance elements L1 and L5. Thus, electrical power and reception and transmission signals are transmitted.

Ninth Example of Electromagnetic Coupling Module

Figure 28:
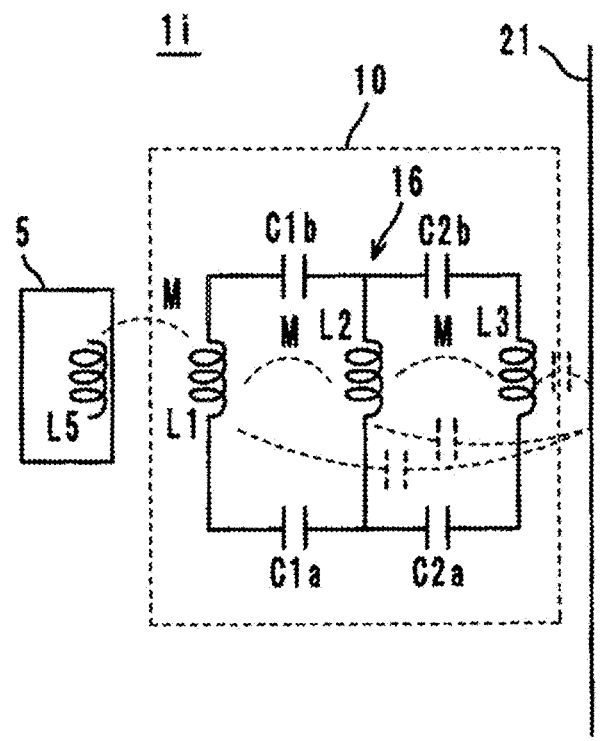
FIG. 28 is an equivalent circuit diagram of a ninth example of the electromagnetic coupling module.

As shown by an equivalent circuit in FIG. 28, in an electromagnetic coupling module 1i, which is a ninth example, a feed circuit 16 includes inductance elements L1, L2, and L3 that are tightly coupled to one another via a magnetic field. The inductance element L1 is coupled to an inductance element L5 provided to the wireless IC chip 5 via a magnetic field. The inductance element L2 and capacitance elements C1a and C1b define an LC series resonant circuit. The inductance element L3 and capacitance elements C2a and C2b define an LC series resonant circuit. In addition, each of the inductance elements L1, L2, and L3 is coupled to the dielectric body 21 via an electromagnetic field.

Figure 29:
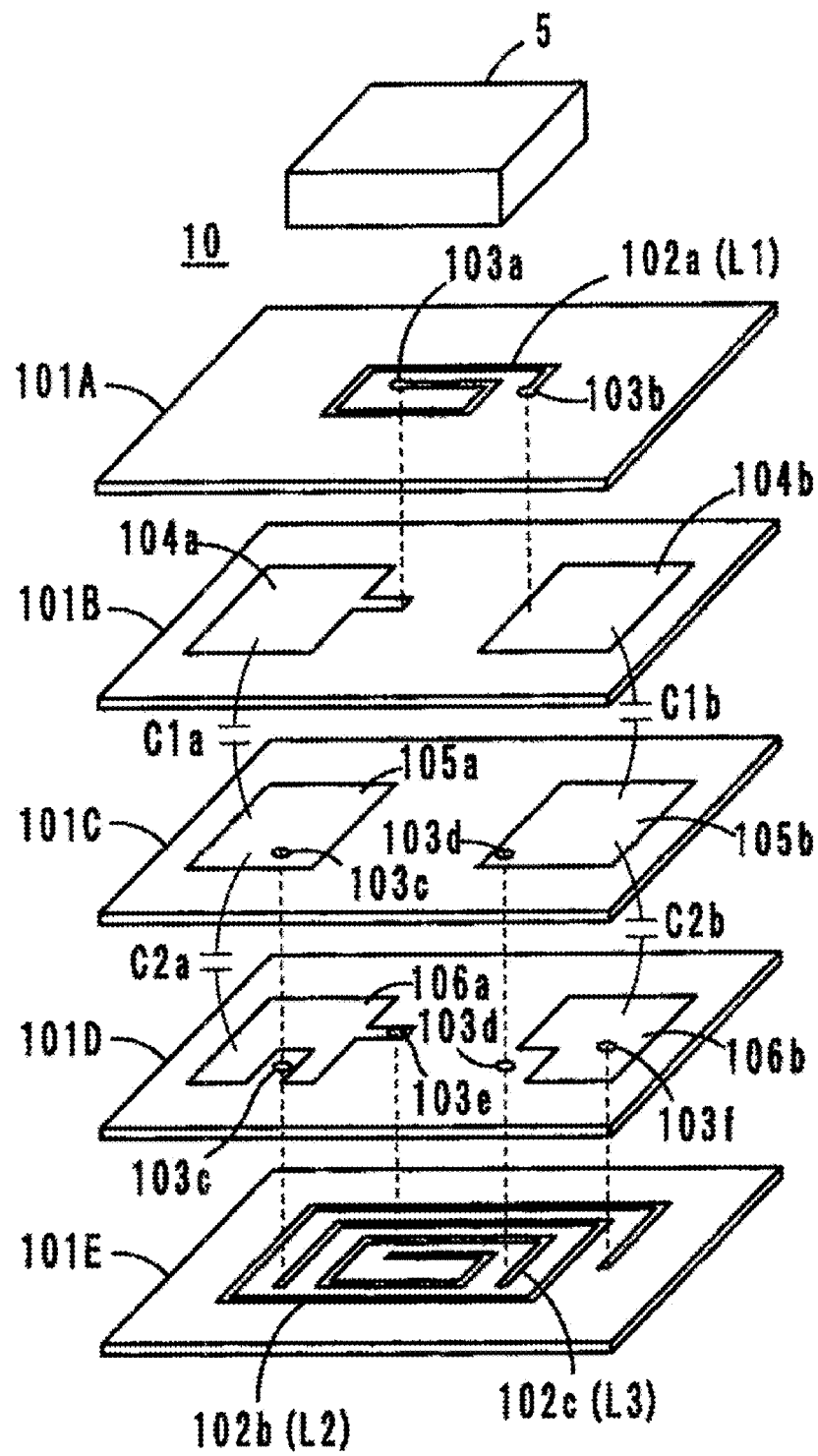
FIG. 29 is an exploded perspective view illustrating a feed circuit board of the ninth example.

More specifically, as shown in FIG. 29, a feed circuit board 10 is preferably formed by stacking, pressing, and sintering ceramic sheets 101A to 101E, which are made of a dielectric material. The sheet 101A includes an inductor electrode 102a and via hole conductors 103a and 103b provided therein. The sheet 101B includes capacitor electrodes 104a and 104b provided therein. The sheet 101C includes capacitor electrodes 105a and 105b and via hole conductors 103c and 103d provided therein. The sheet 101D includes capacitor electrodes 106a and 106b, the via hole conductors 103c and 103d, and via hole conductors 103e and 103f provided therein. The sheet 101E includes inductor electrodes 102b and 102c provided therein. That is, a space is provided between the electrodes 104a and 105a, between 105a and 106a, between 104b and 105b, and between 105b and 106b which form the capacitance elements C1a, C2a, C1b, and C2b, respectively, so that the magnetic flux emanating from the inductance element L1 reaches the inductance element L2 and L3, and further to the dielectric body 21.

By stacking the above-described sheets 101A to 101E, the inductor electrode 102a defines the inductance element L1. The inductor electrode 102b defines the inductance element L2. The inductor electrode 102c defines the inductance element L3. The capacitor electrodes 104a and 105a define the capacitance element C1a. The capacitor electrodes 104b and 105b define the capacitance element C1b. The capacitor electrodes 105a and 106a define the capacitance element C2a. In addition, the capacitor electrodes 105b and 106b define the capacitance element C2b.

One end of the inductance element L1 is connected to the capacitor electrode 104a through the via hole conductor 103a, while the other end is connected to the capacitor electrode 104b through the via hole conductor 103b. One end of the inductance element L2 is connected to the capacitor electrode 105a through the via hole conductor 103c, while the other end is connected to the capacitor electrode 106b through the via hole conductor 103f. One end of the inductance element L3 is connected to the capacitor electrode 106a through the via hole conductor 103e, while the other end is connected to the capacitor electrode 105b through the via hole conductor 103d.

In addition, as shown in FIG. 27, a coil-shaped electrode 99 serving as a chip-side electrode is provided on the back surface of the wireless IC chip 5. The coil-shaped electrode 99 serves as the inductance element L5. Note that a protective film made of, for example, a resin is coated on a surface of the coil-shaped electrode 99. In this manner, the inductance element L1 defined by a coil-shaped electrode functioning as a board-side electrode is coupled to the coil-shaped electrode 99 via a magnetic field.

The operations and advantages of the ninth example are substantially the same as those of the above-described seventh example. In the ninth example, capacitance is generated, via the dielectric body 21, between one end and the other end of a portion of an electrode defined by the inductor electrodes 102a, 102b, and 102c and facing the dielectric body 21. Due to this capacitance, an electric field is generated in the dielectric body 21. The electric field propagates in the dielectric body 21 and further propagates to outside the dielectric body 21. Thus, a signal is transmitted.

That is, the electromagnetic coupling module 1i receives a high-frequency signal (e.g., a UHF band signal) radiated from a reader/writer (not shown) using the dielectric body 21. Thereafter, the electromagnetic coupling module 1i causes the feed circuit 16 (the LC series resonant circuit including the inductance element L2 and the capacitance elements C1a and C1b and the LC series resonant circuit including the inductance element L3 and the capacitance elements C2a and C2b) electromagnetically coupled with the dielectric body 21 to resonate. In this manner, the electromagnetic coupling module 1i supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance elements L1, L2, and L3 thereof to the dielectric body 21 using electric field coupling. Thus, the transmission signal is transmitted and transferred from the dielectric body 21 to the reader/writer. The feed circuit 16 is coupled to the wireless IC chip 5 via a magnetic field using the inductance elements L1 and L5. Thus, electrical power and reception and transmission signals are transmitted.

In particular, in the ninth example, since the feed circuit 16 includes the plurality of LC resonant circuits including the inductance elements L2 and L3 coupled with each other via a magnetic field, the frequency range can be increased, as in the above-described seventh example.

Tenth Example of Electromagnetic Coupling Module

Figure 30:
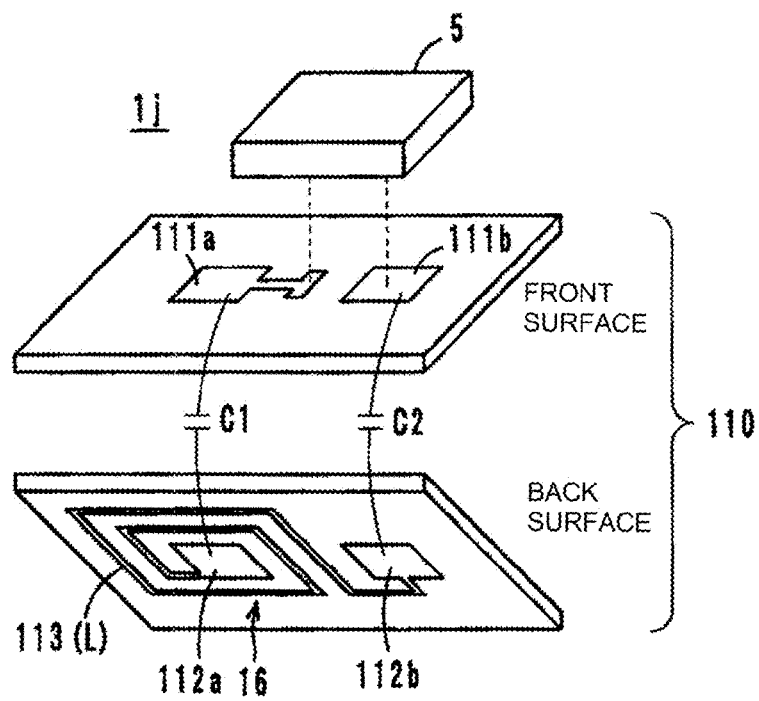
FIG. 30 is an exploded perspective view illustrating a tenth example of the electromagnetic coupling module.

An electromagnetic coupling module 1j, which is a tenth example, includes a feed circuit board 110 defined by a single-layer board. The equivalent circuit of the electromagnetic coupling module 1j is substantially the same as that shown in FIG. 11. That is, the feed circuit 16 includes an LC series resonant circuit in which capacitance elements C1 and C2 are connected to either end of an inductance element L. The feed circuit board 110 is preferably a dielectric ceramic board. As shown in FIG. 30, capacitor electrodes 111a and 111b are provided on the front surface of the feed circuit board 110, while capacitor electrodes 112a and 112b and an inductor electrode 113 are provided on the back surface. The capacitance element C1 is defined by the capacitor electrodes 111a and 112a. The capacitance element C2 is defined by the capacitor electrodes 111b and 112b.

The operations and advantages of the tenth example are substantially the same as those of the above-described first example. In the tenth example, capacitance is generated, via the dielectric body 21, between one end and the other end of a portion of the inductor electrode 113 facing the dielectric body 21 and in a portion where the capacitor electrode 112b faces the dielectric body 21. Due to this capacitance, an electric field is generated in the dielectric body 21. The electric field propagates in the dielectric body 21 and further propagates to outside the dielectric body 21. Thus, a signal is transmitted.

That is, the electromagnetic coupling module 1j receives a high-frequency signal (e.g., a UHF band signal) radiated from a reader/writer (not shown) using the dielectric body 21. Thereafter, the electromagnetic coupling module 1j causes the feed circuit 16 (the LC series resonant circuit including the inductance element L and the capacitance elements C1 and C2) electromagnetically coupled with the dielectric body 21 to resonate. In this manner, the electromagnetic coupling module 1j supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance element L thereof to the dielectric body 21 using electric field coupling. Thus, the transmission signal is transmitted and transferred from the dielectric body 21 to the reader/writer.

Figure 31:
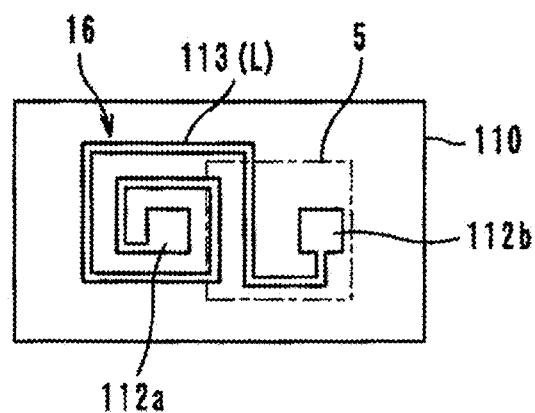
FIG. 31 is a bottom view of a feed circuit board having a wireless IC chip mounted thereon in the tenth example.
Figure 32:
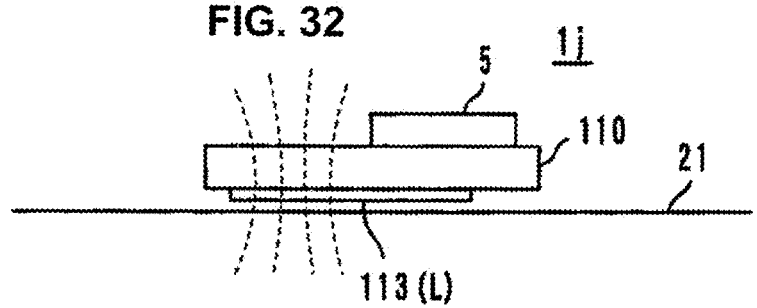
FIG. 32 is a side view of the tenth example.

In particular, in the tenth example, as shown in FIGS. 31 and 32, the inductance element L is arranged so as to only partially overlap with the wireless IC chip 5 in plan view.

Accordingly, the magnetic flux generated by the inductance element L is not substantially blocked by the wireless IC chip 5, and therefore, a significant increase of the magnetic flux can be obtained.

Figure 33:
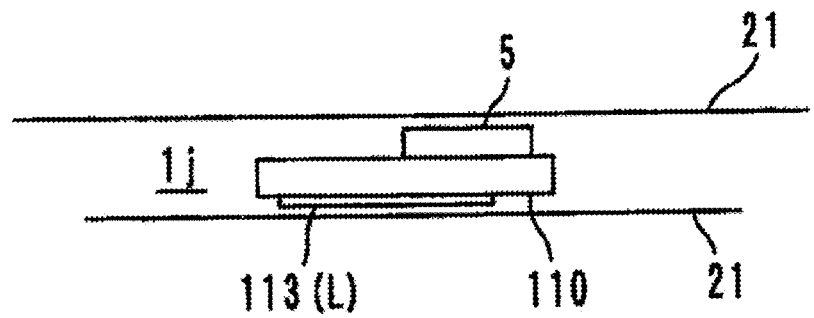
FIG. 33 is a side view of a modification of the tenth example.

Note that, in the tenth example, as shown in FIG. 33, the feed circuit board 110 having the wireless IC chip 5 mounted thereon may preferably be sandwiched by the dielectric bodies 21 and 21. Alternatively, the feed circuit board 110 having the wireless IC chip 5 mounted thereon may preferably be disposed in a gap provided in the dielectric body 21. In this manner, the electric field coupling efficiency between the feed circuit 16 and each of the dielectric bodies 21 and 21 can be improved, and therefore, the gain can be increased.

Eleventh Example of Electromagnetic Coupling Module

Figure 34:
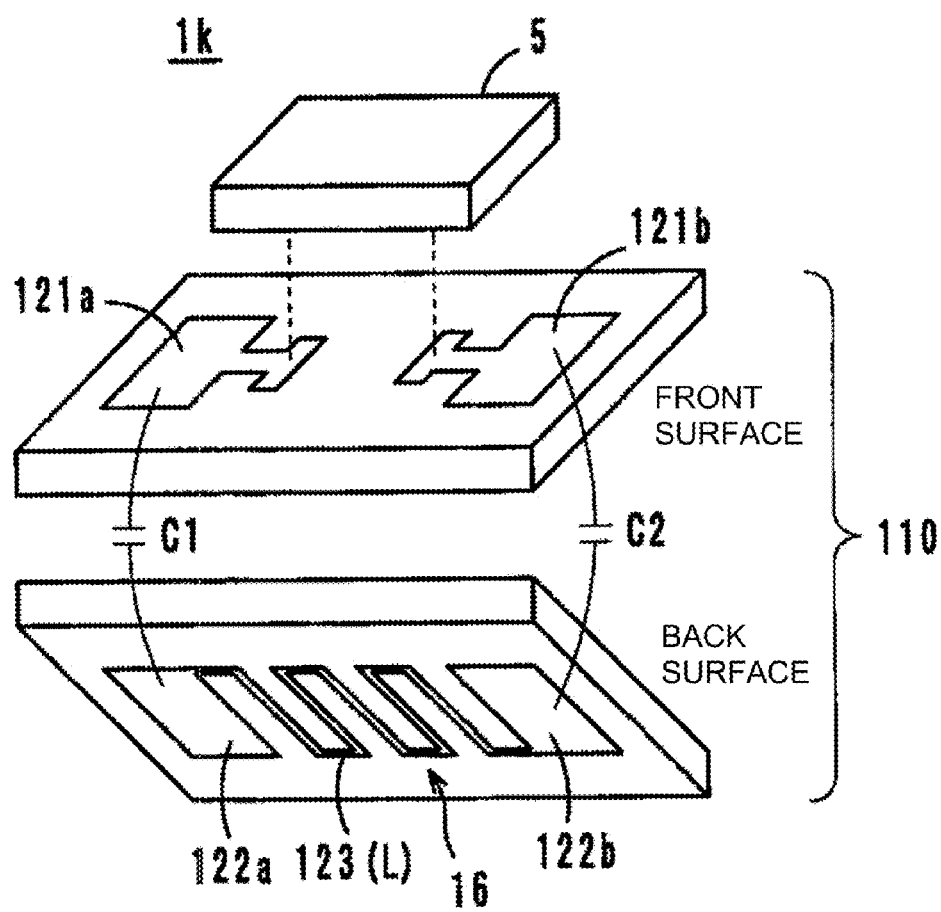
FIG. 34 is an exploded perspective view illustrating an eleventh example of the electromagnetic coupling module.

An electromagnetic coupling module 1k, which is an eleventh example, includes an inductance element L defined by a meandering line electrode. The equivalent circuit of the electromagnetic coupling module 1k is substantially the same as that shown in FIG. 11. That is, the feed circuit 16 includes an LC series resonant circuit in which capacitance elements C1 and C2 are connected to either end of the inductance element L. A feed circuit board 110 is preferably a dielectric ceramic single-layer board. As shown in FIG. 34, capacitor electrodes 121a and 121b are provided on the front surface of the feed circuit board 110, while capacitor electrodes 122a and 122b and a meandering inductor electrode 123 are provided on the back surface. The capacitance element C1 is defined by the capacitor electrodes 121a and 122a. The capacitance element C2 is defined by the capacitor electrodes 121b and 122b.

The operations and advantages of the eleventh example are substantially the same as those of the above-described first example. In the eleventh example, capacitance is generated, via the dielectric body 21, between one end and the other end of a portion of the inductor electrode 123 facing the dielectric body 21 and in portions where the capacitor electrodes 122a and 122b face the dielectric body 21. Due to this capacitance, an electric field is generated in the dielectric body 21. The electric field propagates in the dielectric body 21 and further propagates to outside the dielectric body 21. Thus, a signal is transmitted.

That is, the electromagnetic coupling module 1k receives a high-frequency signal (e.g., a UHF band signal) radiated from a reader/writer (not shown) using a dielectric body (not shown) facing the inductor electrode 123. Thereafter, the electromagnetic coupling module 1k causes the feed circuit 16 (the LC series resonant circuit including the inductance element L and the capacitance elements C1 and C2) coupled with the dielectric body via an electromagnetic field to resonate. In this manner, the electromagnetic coupling module 1k supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance element L and the capacitance elements C1 and C2 thereof to the dielectric body using electric field coupling. Thus, the transmission signal is transmitted and transferred from the dielectric body to the reader/writer.

In particular, in the eleventh example, since the inductance element L is formed from the meandering inductor electrode 123, the transmission and reception efficiency of a high-frequency signal can be improved.

Note that, in the above-described tenth and eleventh examples, the feed circuit board 110 can preferably be defined by a multilayer board.

Twelfth Example of Electromagnetic Coupling Module

Figure 35:
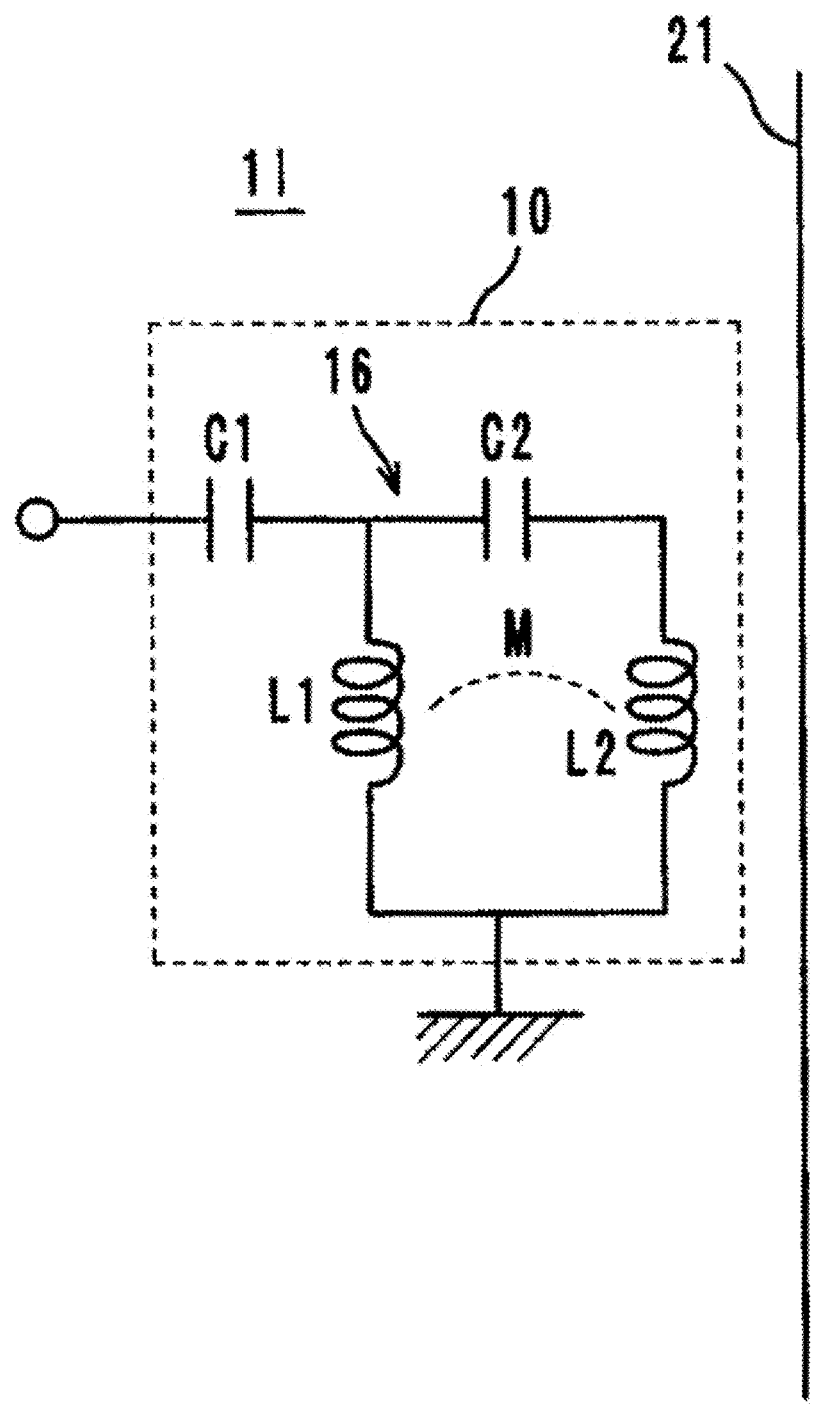
FIG. 35 is an equivalent circuit diagram of a twelfth example of the electromagnetic coupling module.

As shown by an equivalent circuit in FIG. 35, in an electromagnetic coupling module 1l, which is a twelfth example, a feed circuit 16 includes inductance elements L1 and L2 that are coupled to each other via a magnetic field. One end of the inductance element L1 is connected to a wireless IC chip via the capacitance element C1, while the other end is connected to ground. The inductance element L2 is connected to the one end of the inductance element L1 via the capacitance element C2, while the other end is connected to ground. That is, the feed circuit 16 includes an LC series resonant circuit including the inductance element L1 and the capacitance element C1 and an LC series resonant circuit including the inductance element L2 and the capacitance element C2. The resonant circuits are coupled with each other using magnetic field coupling indicated by the mutual inductance M. In addition, each of the inductance elements L1 and L2 is coupled to the dielectric body 21 via an electromagnetic field.

Figure 36:
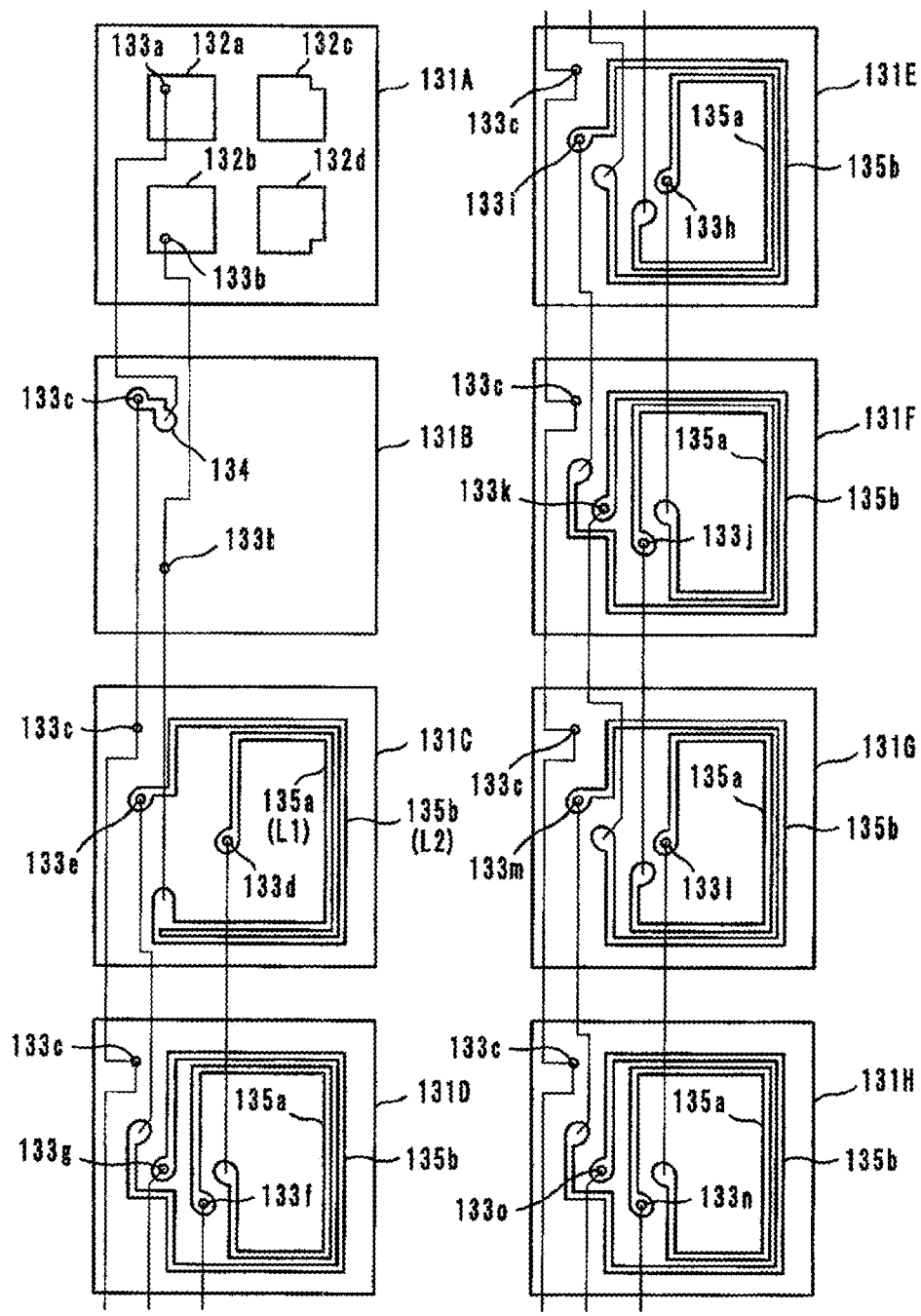
FIG. 36 illustrates plan views of an exploded feed circuit board of the twelfth example.
Figure 37:
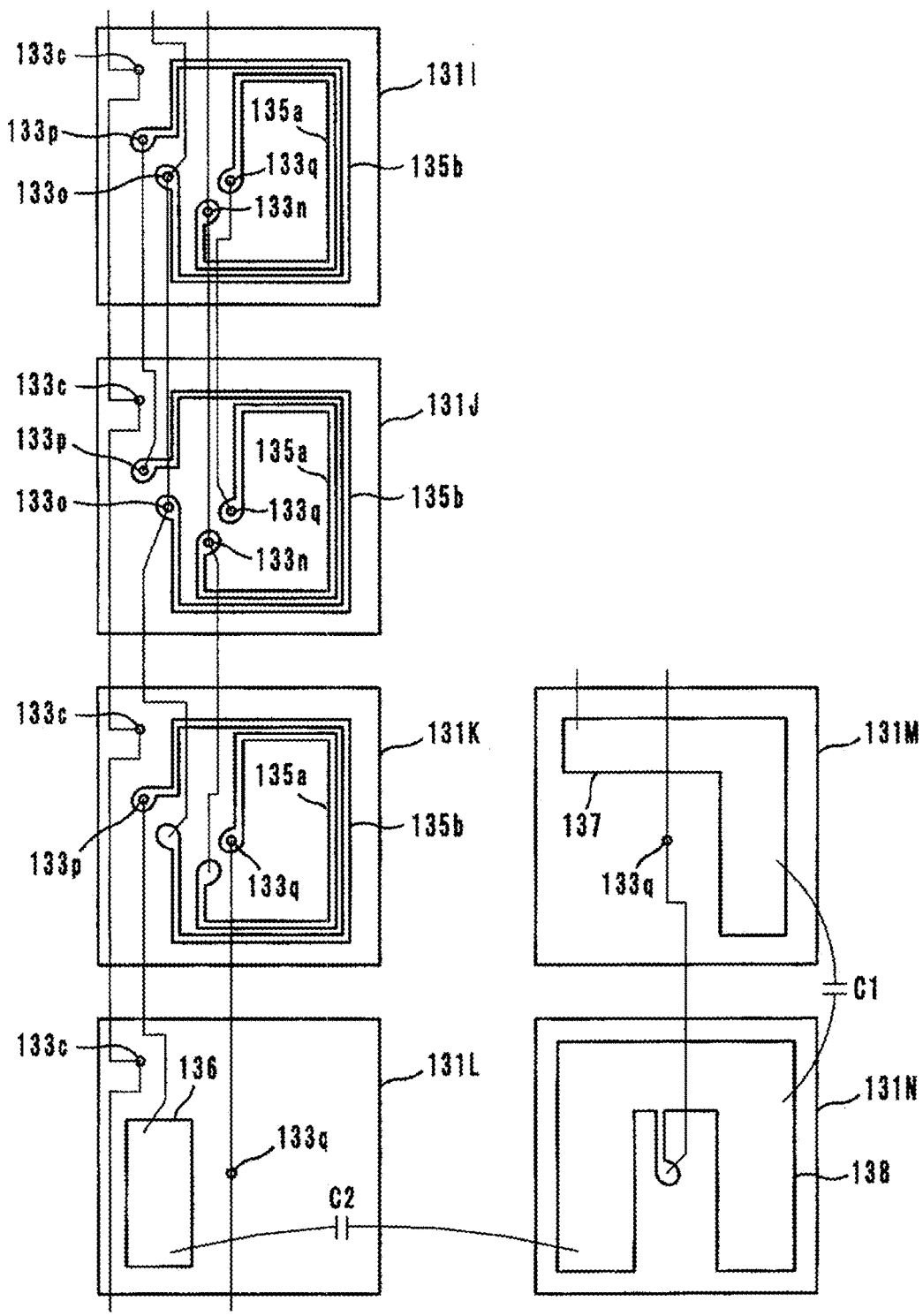
FIG. 37 illustrates exploded plan views of the feed circuit board of the twelfth example that is continued from FIG. 36.

More specifically, as shown in FIGS. 36 and 37, a feed circuit board 10 is formed by stacking, pressing, and sintering ceramic sheets 131A to 131N, which are mage of a dielectric material. The sheet 131A includes wireless-IC-chip mounting electrodes 132a to 132d and via hole conductors 133a and 133b provided therein. The sheet 131B includes an interconnection electrode 134 and via hole conductors 133c and the via hole conductor 133b provided therein. Each of the sheets 131C to 131K includes inductor electrodes 135a and 135b and via hole conductors 133c to 133q provided therein. The sheet 131L includes a capacitor electrode 136 and the via hole conductors 133c and 133q provided therein. The sheet 131M includes a capacitor electrodes 137 and the via hole conductor 133q provided therein. The sheet 131N includes a capacitor electrode 138 provided therein.

By stacking the above-described sheets 131A to 131N, the inductor electrodes 135a are connected with one another using the via hole conductors 133d, 133f, 133h, 133j, 133l, 133n, and 133q so as to define the inductance element L1. The inductor electrodes 135b are connected with one another using the via hole conductors 133e, 133g, 133i, 133k, 133m, 133o, and 133p so as to define the inductance element L2. The capacitor electrodes 137 and 138 define the capacitance element C1. The capacitor electrode 137 is connected to the wireless-IC-chip mounting electrode 132a via the via hole conductor 133c, the interconnection electrode 134, and the via hole conductor 133a. In addition, the capacitor electrodes 136 and 138 define the capacitance element C2. The capacitor electrode 136 is connected to one end of the inductance element L2 through the via hole conductor 133p provided in the sheet 131K. The capacitor electrode 138 is connected to one end of the inductance element L1 through the via hole conductor 133q. Furthermore, the other end of the inductance element L1 and the other end of the inductance element L2 are connected to the wireless-IC-chip mounting electrode 132b through the via hole conductor 133b. Note that the wireless-IC-chip mounting electrode 132a disposed on the front surface of the feed circuit board 10 is preferably connected to an antenna terminal of the wireless IC chip, and the wireless-IC-chip mounting electrode 132b is preferably connected to a ground terminal of the wireless IC chip.

The operations and advantages of the twelfth example are substantially the same as those of the above-described seventh example. In the twelfth example, a capacitance is generated primarily in a portion at which the capacitor electrode 138 faces the dielectric body 21 via the dielectric body 21. Due to this capacitance, an electric field is generated in the dielectric body 21. The generated electric field propagates in the dielectric body 21 and to outside the dielectric body 21. Thus, a signal is transmitted.

That is, the electromagnetic coupling module **1*l* receives a high-frequency signal (e.g., a UHF band signal) radiated from a reader/writer (not shown) using the dielectric body 21. Thereafter, the electromagnetic coupling module 1*l* causes the feed circuit 16 (the LC series resonant circuit including the inductance element L1 and the capacitance element C1 and the LC series resonant circuit including the inductance element L2 and the capacitance element C2) electromagnetically coupled with the dielectric body 21 to resonate. In this manner, the electromagnetic coupling module 1*l* supplies only a reception signal in a predetermined frequency range to the wireless IC chip 5. On the other hand, the feed circuit 16 retrieves predetermined energy from the reception signal. Thereafter, the feed circuit 16 retrieves an information signal stored in the wireless IC chip 5 using the energy as a driving source and converts the signal so that the signal matches a predetermined frequency. Subsequently, the feed circuit 16 sends a transmission signal from the inductance elements L1 and L2 and the capacitance electrode 138 thereof to the dielectric body 21 using electric field coupling. Thus, the transmission signal is transmitted and transferred from the dielectric body 21** to the reader/writer.

The article having an electromagnetic coupling module attached thereto according to the present invention is not limited to the above-described preferred embodiments and examples thereof. Various modifications can be made without departing from the spirit and scope of the present invention.

In particular, an article to which the electromagnetic coupling module is attached is not limited to those illustrated in the above-described preferred embodiments. The electromagnetic coupling module can be attached to a variety of types of article. For example, as shown in FIGS. 2 to 4, an impedance conversion interconnection electrode may be provided on a dielectric film. The impedance conversion interconnection electrode may be coupled to the electromagnetic coupling module via an electromagnetic field. Subsequently, the dielectric film may be bonded to a predetermined article. In addition, the details of the internal structure of the feed circuit board may be freely configured. Furthermore, a wireless IC chip may be bonded to the feed circuit board using a method other than a solder bump.

Still furthermore, the feed circuit board may preferably be a flexible dielectric board, such as a polyimide or liquid crystal polymer board, for example, in addition to a rigid board.

As described above, preferred embodiments of the present invention are advantageous for an article having an electromagnetic coupling module attached thereto. In particular, preferred embodiments of the present invention are advantageous in that it is widely applicable to a variety of articles having a compact shape and reliable frequency characteristic.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An article having an electromagnetic coupling module attached thereto, comprising:
    an electromagnetic coupling module including a wireless IC chip arranged to process a transmission signal and a reception signal and a feed circuit board connected to the wireless IC chip, the feed circuit board including a feed circuit, the feed circuit including a resonant circuit having a predetermined resonant frequency; and
    a dielectric body having the feed circuit board bonded thereto; wherein
    the feed circuit matches a characteristic impedance between the dielectric body and the wireless IC chip; and
    the dielectric body functions as a radiator to radiate a transmission signal supplied from the feed circuit via electromagnetic field coupling and to supply a received reception signal to the feed circuit via electromagnetic field coupling.

2. The article having an electromagnetic coupling module attached thereto according to claim 1, wherein the dielectric body includes a first dielectric body that defines a container and a second dielectric body contained in the first dielectric body.

3. The article having an electromagnetic coupling module attached thereto according to claim 2, wherein the second dielectric body is a liquid.

4. The article having an electromagnetic coupling module attached thereto according to claim 1, wherein
    a resonant frequency of a signal radiated from the dielectric body is substantially the same as a self-resonance frequency of the feed circuit; and
    a maximum gain of the transmission and reception signals is substantially determined by at least one of a size and a shape of the feed circuit board, a distance between the feed circuit board and the dielectric body, and a medium disposed between the feed circuit board and the dielectric body.

5. The article having an electromagnetic coupling module attached thereto according to claim 1, wherein a dimension of the dielectric body in a direction perpendicular or substantially perpendicular to the electromagnetic coupling module is at least about $\frac{1}{8}\lambda$ of a center frequency.

6. The article having an electromagnetic coupling module attached thereto according to claim 1, further comprising:
    an impedance conversion interconnection electrode located near the electromagnetic coupling module; wherein
    the impedance conversion interconnection electrode is disposed on or inside the dielectric body.

7. The article having an electromagnetic coupling module attached thereto according to claim 1, further comprising:
    an impedance conversion interconnection electrode disposed close to the electromagnetic coupling module; wherein
    the impedance conversion interconnection electrode is provided on another dielectric body that is disposed on or inside the dielectric body.

8. The article having an electromagnetic coupling module attached thereto according to claim 1, wherein the wireless IC chip is connected to the feed circuit board so as to be electrically conductive with each other.

9. The article having an electromagnetic coupling module attached thereto according to claim 1, wherein the wireless IC chip is coupled to the feed circuit board via at least one of a magnetic field and an electric field.

10. The article having an electromagnetic coupling module attached thereto according to claim 1, wherein the feed circuit is a lumped constant resonant circuit including a capacitance element and an inductance element.

11. The article having an electromagnetic coupling module attached thereto according to claim 10, wherein the lumped constant resonant circuit is one of an LC series resonant circuit and an LC parallel resonant circuit.

12. The article having an electromagnetic coupling module attached thereto according to claim 10, wherein the lumped constant resonant circuit includes a plurality of LC series resonant circuits or a plurality of LC parallel resonant circuits.

13. The article having an electromagnetic coupling module attached thereto according to claim 10, wherein the capacitance element is disposed between the wireless IC chip and the inductance element.

14. The article having an electromagnetic coupling module attached thereto according to claim 10, wherein the feed circuit board is a multilayer board defined by a stack of a plurality of dielectric layers or a plurality of magnetic layers, and the capacitance element and the inductance element are provided on or within the multilayer board.

15. The article having an electromagnetic coupling module attached thereto according to claim 10, wherein the feed circuit board is one of a dielectric single-layer board and a magnetic single-layer board, and at least one of the capacitance element or the inductance element are provided on a surface of the single-layer board.

16. The article having an electromagnetic coupling module attached thereto according to claim 1, wherein the feed circuit board is a rigid or flexible board made of a resin or a ceramic.

* * * * *